(12) United States Patent
Chen et al.

(10) Patent No.: US 9,666,792 B2
(45) Date of Patent: May 30, 2017

(54) SHADOW-EFFECT COMPENSATED FABRICATION OF MAGNETIC TUNNEL JUNCTION (MTJ) ELEMENTS

(71) Applicant: QUALCOMM Incorporated, San Diego, CA (US)

(72) Inventors: Wei-Chuan Chen, San Diego, CA (US); Yu Lu, San Diego, CA (US); Chando Park, Irvine, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/824,507

(22) Filed: Aug. 12, 2015

(65) Prior Publication Data

US 2017/0047510 A1    Feb. 16, 2017

(51) Int. Cl.
| | | |
|---|---|---|
| H01L 21/02 | (2006.01) | |
| H01L 43/12 | (2006.01) | |
| H01L 43/08 | (2006.01) | |
| H01L 27/22 | (2006.01) | |
| H01L 43/02 | (2006.01) | |

(52) U.S. Cl.
CPC ............ *H01L 43/12* (2013.01); *H01L 27/222* (2013.01); *H01L 43/02* (2013.01); *H01L 43/08* (2013.01)

(58) Field of Classification Search
CPC ......... H01L 43/02; H01L 43/12; H01L 43/08; H01L 27/228
USPC ............................................. 438/3; 257/295
See application file for complete search history.

(56) References Cited

U.S. PATENT DOCUMENTS

| | | |
|---|---|---|
| 7,291,506 B2 | 11/2007 | Nakajima et al. |
| 8,344,433 B2 | 1/2013 | Zhu et al. |
| 8,865,008 B2 | 10/2014 | Ding et al. |
| 2009/0208383 A1 | 8/2009 | Tanada et al. |
| 2014/0017817 A1 | 1/2014 | Godet et al. |
| 2014/0084402 A1 | 3/2014 | Shimomura et al. |
| 2014/0170776 A1 | 6/2014 | Satoh et al. |

(Continued)

FOREIGN PATENT DOCUMENTS

JP    2006156685 A    6/2006

OTHER PUBLICATIONS

International Search Report and Written Opinion for PCT/US2016/044380, mailed Oct. 27, 2016, 19 pages.

*Primary Examiner* — Trung Q Dang
(74) *Attorney, Agent, or Firm* — Alan Gordon; Kenneth Vu

(57) ABSTRACT

Shadow-effect compensated fabrication of magnetic tunnel junction (MTJ) semiconductor elements is disclosed. Providing shadow-effect compensated fabrication of MTJ elements can provide reduced free layer sizing for enhanced MTJ operational margin. In certain aspects, to reduce size of a free layer during fabrication of an MTJ to provide enhanced write and retention symmetry, ion beam etching (IBE) fabrication process is employed to fabricate a free layer smaller than the pinned layer. To avoid asymmetrical footing being fabricated in free layer due to shadow-effect of neighboring MTJs, an ion beam directed at the MTJ is shadow-effect compensated. The angle of incidence of the ion beam directed at the MTJ is varied as the MTJ is rotated to be less steep when another MTJ is in directional line of the ion beam and the MTJ being fabricated. Thus, the free layer is etched more uniformly in the MTJ while avoiding increased etching damage.

29 Claims, 19 Drawing Sheets

(56) References Cited

U.S. PATENT DOCUMENTS

| | | |
|---|---|---|
| 2014/0227804 A1 | 8/2014 | Hsu et al. |
| 2015/0090583 A1 | 4/2015 | Kodaira et al. |
| 2015/0263273 A1* | 9/2015 | Yoshikawa ............. H01L 43/08 257/295 |

* cited by examiner

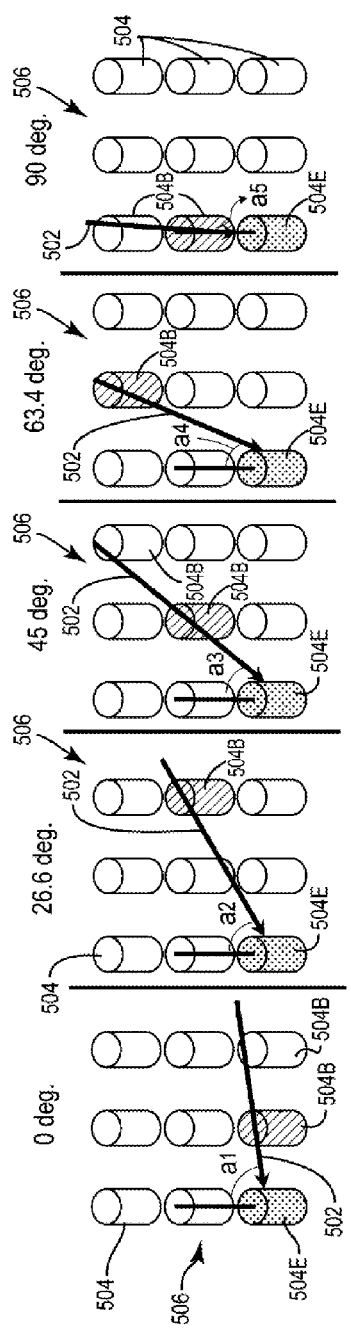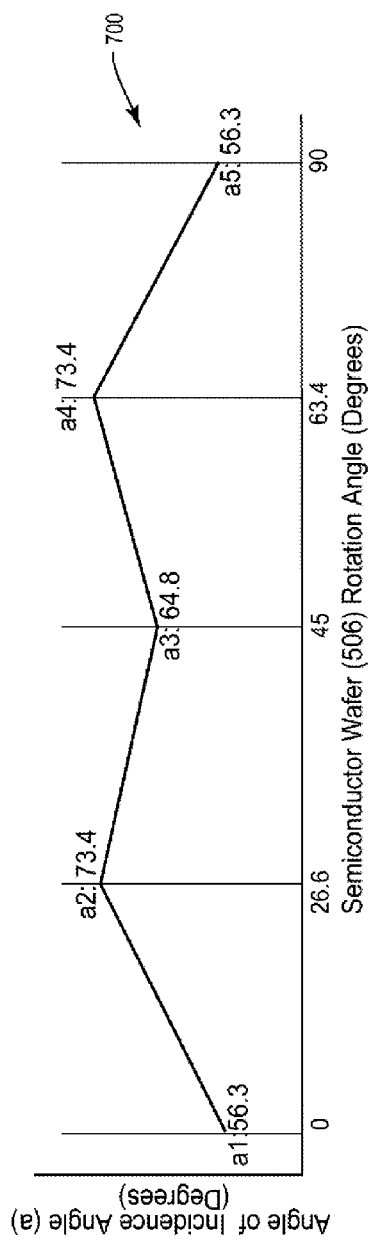
FIG. 6A FIG. 6B FIG. 6C FIG. 6D FIG. 6E
FIG. 7

US 9,666,792 B2

SHADOW-EFFECT COMPENSATED FABRICATION OF MAGNETIC TUNNEL JUNCTION (MTJ) ELEMENTS

BACKGROUND

I. Field of the Disclosure

The technology of the disclosure relates generally to fabrication of magnetic tunnel junction (MTJ) elements in semiconductor devices, and more particularly to MTJ etching.

II. Background

Semiconductor storage devices are used in integrated circuits (ICs) in electronic devices to provide data storage. One example of a semiconductor storage device is a magnetic random access memory (MRAM). MRAM is non-volatile memory in which data is stored by programming a magnetic tunnel junction (MTJ) as part of an MRAM bit cell. One advantage of an MRAM is that MTJs in MRAM bit cells can retain stored information even when power is turned off. This is because data is stored in the MTJ as a small magnetic element rather than an electric charge or current.

In this regard, an MTJ comprises a free ferromagnetic layer ("free layer") disposed above a fixed or pinned ferromagnetic layer ("pinned layer"). The free and pinned layers are separated by a tunnel junction or barrier formed by a thin non-magnetic dielectric layer. The magnetic orientation of the free layer can be changed, but the magnetic orientation of the pinned layer remains fixed or "pinned." Data can be stored in the MTJ according to the magnetic orientation between the free and pinned layers. When the magnetic orientations of the free and pinned layers are anti-parallel (AP) to each other, a first memory state exists (e.g., a logical '1'). When the magnetic orientations of the free and pinned layers are parallel (P) to each other, a second memory state exists. The magnetic orientations of the free and pinned layers can be sensed to read data stored in the MTJ by sensing the resistance when current flows through the MTJ. Data can also be written and stored in the MTJ by applying a magnetic field to change the magnetic moment of the free layer to either a P or AP magnetic orientation with respect to the pinned layer.

Recent developments in MTJ devices involve spin torque transfer (STT)-MRAM devices. In STT-MRAM devices, the spin polarization of electrons, rather than the charge of the electrons, is used to indicate the state stored in the MTJ (i.e., a '0' or a '1'). FIG. 1 illustrates a STT-MTJ 100. The STT-MTJ 100 is provided as part of an MRAM bit cell 102 to store non-volatile data. A metal-oxide semiconductor (typically n-type MOS, i.e., NMOS) access transistor 104 is provided to control reading and writing to the STT-MTJ 100. A drain (D) of the access transistor 104 is coupled to a bottom electrode 106 of the STT-MTJ 100, which is coupled to a pinned layer 108. A write line ($V_{WL}$) is coupled to a gate (G) of the access transistor 104. A source (S) of the access transistor 104 is coupled to a voltage source ($V_S$). A bit line ($V_{BL}$) is coupled to a top electrode 110 of the STT-MTJ 100, which is coupled to a free layer 112. The pinned layer 108 and the free layer 112 are separated by a tunnel barrier 114. When writing data to the STT-MTJ 100, the gate (G) of the access transistor 104 is activated by activating the write line ($V_{WL}$). A voltage differential between the bit line ($V_{BL}$) and the source line ($V_S$) is applied. As a result, a write current (I) is generated between the drain (D) and the source (S).

With continuing reference to FIG. 1, if the magnetic orientation of the STT-MTJ 100 in FIG. 1 is to be changed from AP to P, a write current ($I_{AP-P}$) flowing from the top electrode 110 to the bottom electrode 106 is generated. This induces a spin transfer torque (STT) at the free layer 112 to change the magnetic moment of the free layer 112 to P with respect to the pinned layer 108. If the magnetic orientation is to be changed from P to AP, a current ($I_{P-AP}$) flowing from the bottom electrode 106 to the top electrode 110 is produced, which induces an STT at the free layer 112 to change the magnetic orientation of the free layer 112 to AP with respect to the pinned layer 108. Note that more write current (I) is required to switch the STT-MTJ 100 from a P to AP state than from an AP to P state in an asymmetrical manner due to the different spin-transfer efficiency at both sides of the tunnel barrier 114 of the STT-MTJ 100. The difference in spin-transfer efficiency relates to the difference in magnetic pole coupling between the pinned and free layers 108, 112 when in the AP and P states. Write asymmetry causes greater operational power consumption by the STT-MTJ 100. In this case, a greater write current would be required to switch the STT-MTJ 100 from a P to AP state than from an AP to P state, thus reducing write current operating margin of the STT-MTJ 100. Thus, to provide for greater write current symmetry in the STT-MTJ 100, the pinned layer 108 can be provided in the STT-MTJ 100 to be physically wider than the free layer 112 such that the magnetic fringe field in the pinned layer 108 is located further away from the free layer 112 to reduce magnetic coupling.

MTJ patterning or etching processes are used to fabricate MTJs. Thus, if it is desired to fabricate the STT-MTJ 100 in FIG. 1 to provide for the free layer 112 smaller in width than the pinned layer 108, a suitable MTJ etching process must be used. Currently known methods for MTJ etching include ion beam etching (IBE) and chemical etching in a reactive ion etching (RIE). RIE processes are known to create damage zones around the perimeter of the MTJ. Etching damage in the transition metals (i.e., the pinned layer 108, the free layer 112, and the bottom and top electrodes 106, 110) in the MTJ can affect factors such as a tunnel magnetoresistance (TMR) ratio and energy bather (Eb) variations, which can result in poor MTJ performance. Also, as MTJs become scaled down, such as in high-density MRAMs, these damages zones limit the amount of downscaling.

Another method of MTJ etching involves ion beam etching (IBE). IBE may be used for etching materials that have tendencies to not react well to chemical etching. An IBE etching process can avoid or reduce damage zones over RIE processes, but no chemical component is involved to improve etching selectivity IBE involves directing a charged particle ion beam at a target material to etch the material. FIG. 2 illustrates an example of an MTJ 116 being fabricated by an IBE process to provide a reduced size free layer for greater write and retention symmetry. As shown in FIG. 2, the MTJ 116 is comprised of an MTJ stack-up 118 of a bottom electrode 120, a pinned layer 122, a tunnel bather 124, and a free layer 126 similar to the STT-MTJ 100 in FIG. 1. To protect areas of the MTJ stack-up 118 that are not to be etched during free layer etching, a hard mask 128 is employed as shown in FIG. 2. The hard mask 128 selectively exposes the desired layers of the material to be etched in the MTJ stack-up 118. The result is a pattern provided in the MTJ stack-up 118 that has been masked from exposure. As shown in FIG. 2, the free layer 126 is etched away to be smaller in width than the pinned layer 122. However, a large footing 132 of the free layer 126 material still remains as a function of the hard mark 128. The footing 132 will contribute to write and retention behaviors. If the strength of an ion beam 130 is increased to try to reduce the size of the footing 132, the tunnel barrier 124 and the pinned layer 122 may also be etched resulting in potential damage and material re-deposition that could shorten the pinned and free layers 122, 126.

To solve these issues, the ion beam could be directed at a large angle of incidence towards an MTJ stack-up, as shown in the alternative MTJ 116' in FIG. 3. Directing an ion beam at an angle of incidence towards an MTJ stack-up can reduce the size of a footing in a free layer while minimizing etch damage to the layers below the free layer and material re-deposition. In this regard, FIG. 3 illustrates the MTJ 116' having a smaller footing 132' in the free layer 126' of the MTJ stack-up 118' because of the angle of incidence of the ion beam 130' directed at the MTJ stack-up 118'. IBE is performed while a semiconductor wafer 134 supporting the MTJ stack-up 118' is rotated. During the IBE process, adjacent MTJ 116's cast a "shadow" on other MTJs 116' from certain directions. Thus, the ion beam 130' in FIG. 3 will be blocked from reaching the MTJ stack-up 118' from certain directions as the MTJ stack-up 118' is rotated during fabrication, thus causing an asymmetrical free layer 126'. The shadow-effect will result in greater magnetic coupling between the free layer 126' and the pinned layer 122 in the MTJ stack-up 118' in FIG. 3 than would otherwise exist if the ion beam 130' were not blocked from certain directions during the etching process.

SUMMARY OF THE DISCLOSURE

Aspects of the disclosure involve shadow-effect compensated fabrication of magnetic tunnel junction (MTJ) elements. Providing shadow-effect compensated fabrication of MTJ elements can provide reduced free layer sizing for enhanced MTJ operational margin. Related devices, methods, memory systems are also disclosed. Reducing the size of the free layer during fabrication of an MTJ allows less write current to write data to the MTJ, thus increasing write current operational margin of the MTJ. In certain aspects disclosed herein, to reduce the size of the free layer during fabrication of an MTJ to provide enhanced write and retention symmetry, ion beam etching (IBE) fabrication processes are employed. IBE has advantages of employing a simple hard mask without chemical etching. During the IBE fabrication process, an ion beam is controlled to be directed at an angle of incidence towards an MTJ disposed in a semiconductor wafer to fabricate the free layer to be smaller in size than a pinned layer. To avoid an asymmetrical footing being fabricated in the free layer formed in the MTJ due to a shadow-effect of neighboring MTJs blocking an ion beam at certain angles, the ion beam directed at the MTJ is shadow-effect compensated. The angle of incidence of the ion beam directed at the MTJ is varied as the semiconductor wafer supporting the MTJ is rotated during fabrication. In this manner, as an example, the angle of incidence of the ion beam can be controlled to be less steep when another MTJ is in the directional line of the ion beam and the MTJ being fabricated. Thus, the free layer is etched more uniformly in the MTJ while avoiding increased etching damage that would result from providing only a higher angle of incidence of the ion beam during etching without variation during rotation of the MTJ.

Also, as non-limiting examples, a second IBE or reactive ion etching (RIE) process may be employed to further reduce or remove a free layer footing after angular IBE etching is employed to etch the free layer.

In this regard in one aspect, a method of fabricating an MTJ in a semiconductor wafer is provided. The method comprises providing an MTJ stack-up on a substrate in the semiconductor wafer, the MTJ stack-up comprising a pinned layer disposed above a bottom electrode on the substrate, a free layer disposed above the pinned layer, a tunnel barrier disposed between the pinned layer and the free layer, and a hard mask disposed above the free layer. The method also comprises forming at least one MTJ from the MTJ stack-up. The method also comprises rotating the semiconductor wafer to angularly rotate the MTJ stack-up with reference to an ion beam source. The method also comprises directing a shadow-effect compensated ion beam from the ion beam source at an angle of incidence towards the hard mask during the rotating of the MTJ stack-up to etch the hard mask in the MTJ stack-up. The method also comprises fabricating the free layer smaller in width than the pinned layer in the MTJ stack-up.

In another aspect, an MTJ in semiconductor logic that can be provided in a semiconductor die is provided. The MTJ comprises a pinned layer of a pinned layer width disposed above a bottom electrode. The MTJ also comprises a free layer disposed above the pinned layer, the free layer having a free layer width smaller than the pinned layer width. The MTJ also comprises a tunnel bather disposed between the pinned layer and the free layer. The MTJ also comprises a shadow-effect compensated ion beam etched hard mask disposed above the free layer.

In another aspect, a magnetic random access memory (MRAM) system is provided. The MRAM system comprises an MRAM array provided in a semiconductor die, the MRAM array comprising a plurality of MRAM bit cells. Each of the plurality of MRAM bit cells comprises an access transistor comprising a gate coupled to a write line, a first electrode, and a second electrode. Each of the plurality of MRAM bit cells also comprises an MTJ. The MTJ comprises a first electrode layer coupled to a bitline. The MTJ also comprises a second electrode layer coupled to an electrode of the access transistor. The MTJ also comprises a tunnel barrier between the first electrode layer and the second electrode layer. The MTJ also comprises a pinned layer having a pinned layer width, the pinned layer disposed between the second electrode and the tunnel barrier. The MTJ also comprises a free layer between the first electrode and the tunnel barrier, the free layer having a free layer width smaller than the pinned layer width. The MTJ also comprises a shadow-effect compensated ion beam etched hard mask disposed above the free layer between the free layer and the first electrode layer.

BRIEF DESCRIPTION OF THE FIGURES

FIGS. 6A-6E are schematic diagrams illustrating directing of a shadow-effect compensated ion beam in an IBE process towards MTJ stack-ups on semiconductor logic at varying exemplary angles of incidence as the semiconductor logic is rotated to etch a free layer smaller in size than a pinned layer for increased write and retention symmetry;

FIG. 7 is a graph illustrating the varying angles of incidence of the shadow-effect compensated ion beam as the MTJ stack-ups on the semiconductor logic in FIGS. 6A-6E are rotated;

DETAILED DESCRIPTION

Figure 1:
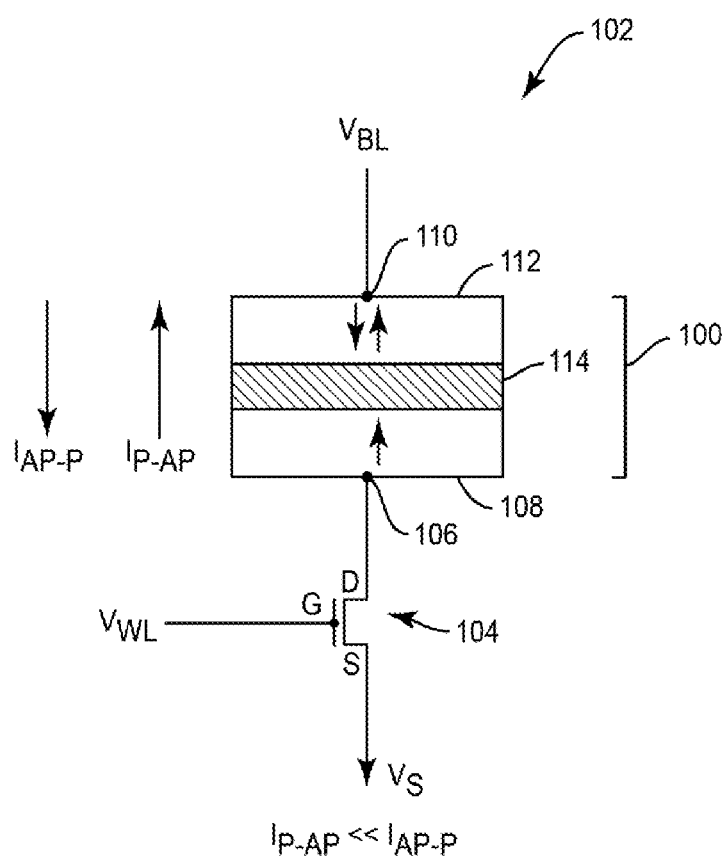
FIG. 1 is a schematic diagram of an exemplary spin torque transfer (STT) magnetic tunnel junction (MTJ) (STT-MTJ) provided in an MRAM bit cell to store data as a function of the magnetization directions of a pinned layer and a free layer in the STT-MTJ.
Figure 2:
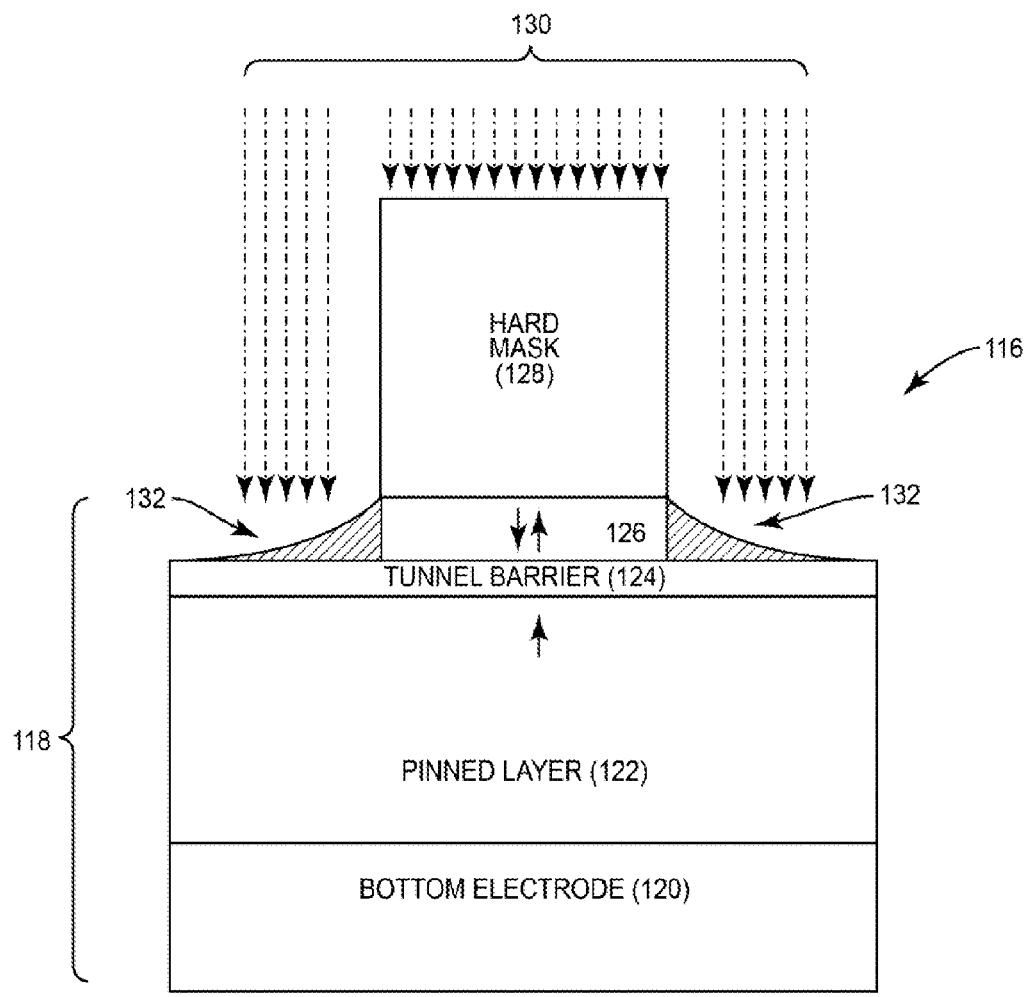
FIG. 2 is a schematic diagram of an exemplary MTJ being ion beam etched (IBE) to provide for a free layer to be smaller in width than a pinned layer to reduce magnetic coupling between the free layer and the pinned layer to provide enhanced operational margin in the fabricated MTJ.
Figure 3:
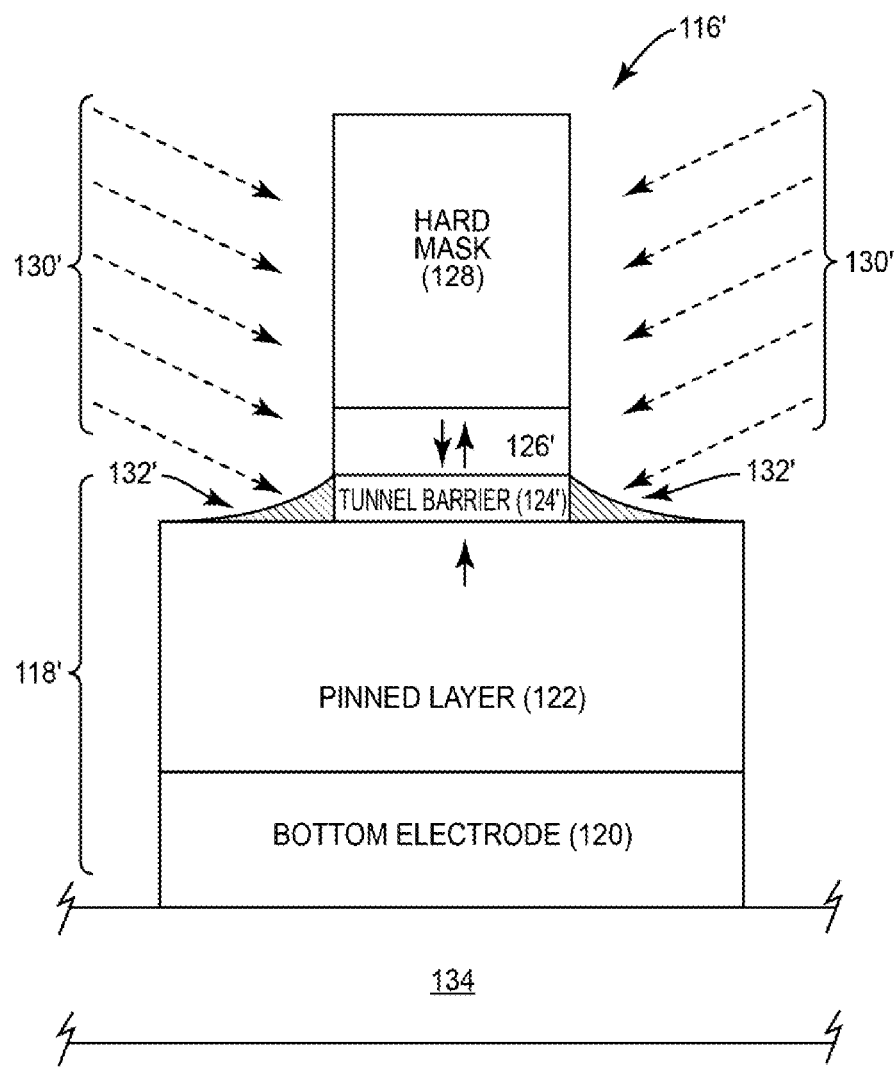
FIG. 3 is a schematic diagram of an alternative exemplary MTJ in FIG. 2 being ion beam etched (IBE) at a steeper angle of incidence to provide for a smaller footing in a free layer.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the disclosure involve shadow-effect compensated fabrication of magnetic tunnel junction (MTJ) elements. Providing shadow-effect compensated fabrication of MTJ elements can provide reduced free layer sizing for enhanced MTJ operational margin. Related devices, methods, memory systems are also disclosed. Reducing the size of the free layer during fabrication of an MTJ allows less write current to write data to the MTJ, thus increasing write current operational margin of the MTJ. In certain aspects disclosed herein, to reduce the size of the free layer during fabrication of an MTJ to provide enhanced write and retention symmetry, ion beam etching (IBE) fabrication processes are employed. IBE has advantages of employing a simple hard mask without chemical etching. During the IBE fabrication process, an ion beam is controlled to be directed at an angle of incidence towards an MTJ disposed in a semiconductor wafer to fabricate the free layer to be smaller in size than a pinned layer. To avoid an asymmetrical footing being fabricated in the free layer formed in the MTJ due to a shadow-effect of neighboring MTJs blocking an ion beam at certain angles, the ion beam directed at the MTJ is shadow-effect compensated. The angle of incidence of the ion beam directed at the MTJ is varied as the semiconductor wafer supporting the MTJ is rotated during fabrication. In this manner, as an example, the angle of incidence of the ion beam can be controlled to be less steep when another MTJ is in the directional line of the ion beam and the MTJ being fabricated. Thus, the free layer is etched more uniformly in the MTJ while avoiding increased etching damage that would result from providing only a higher angle of incidence of the ion beam during etching without variation during rotation of the MTJ.

Also, as non-limiting examples, a second IBE or reactive ion etching (RIE) process may be employed to further reduce or remove a free layer footing after angular IBE etching is employed to etch the free layer.

Figure 4:
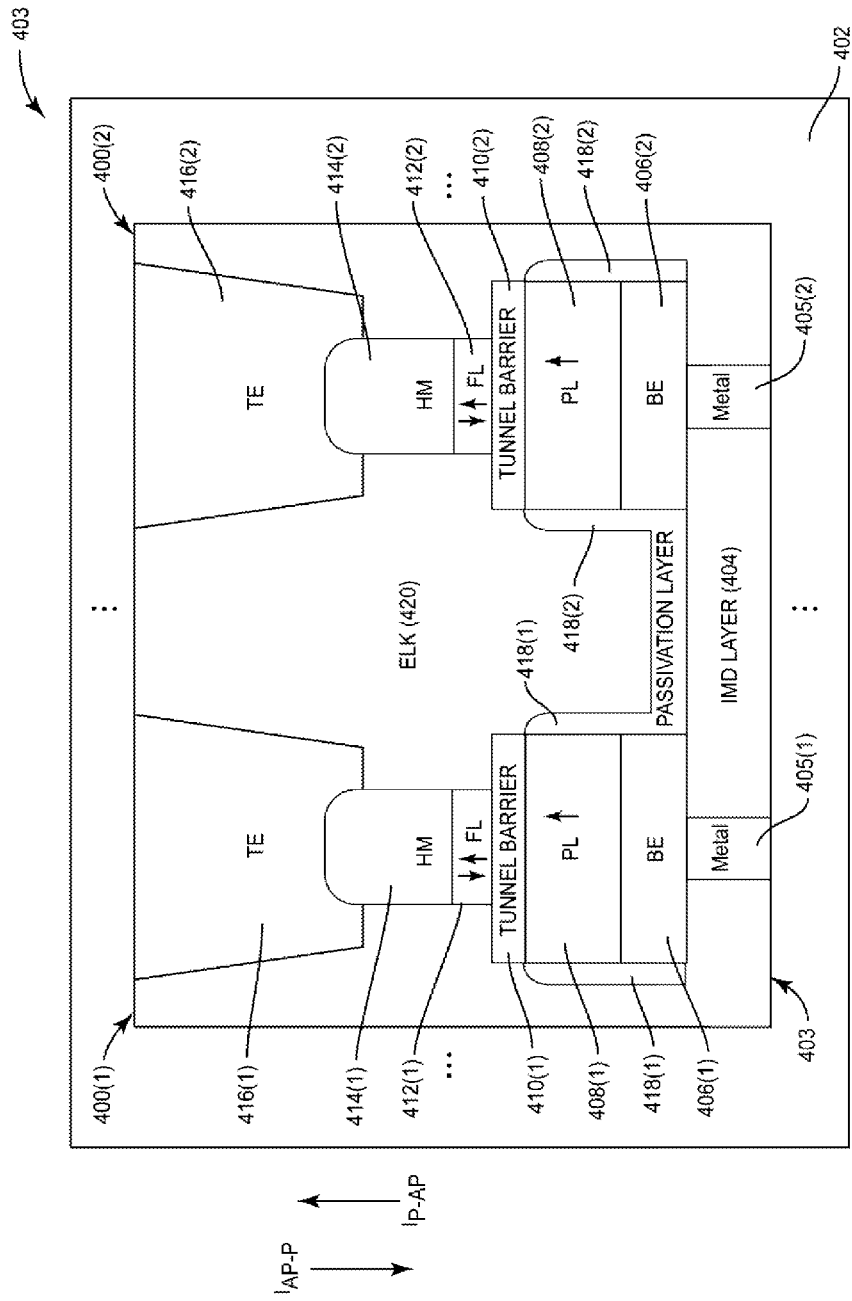
FIG. 4 is a schematic diagram of exemplary MTJs in semiconductor logic fabricated using a shadow-effect compensated IBE process that varies an angle of incidence of an ion beam directed to the MTJ to etch a free layer smaller in size than a pinned layer for increased write and retention symmetry.

In this regard, before discussing exemplary shadow-effect compensated IBE processes for fabricating MTJs, FIG. 4 is provided. FIG. 4 illustrates exemplary fabricated MTJs 400(1), 400(2) in semiconductor logic 402 in a semiconductor die 403 fabricated using a shadow-effect compensated IBE process. For examples, the MTJs 400(1), 400(2) may be spin torque transfer (STT) MTJs. As will be discussed in more detail below, the shadow-effect compensated IBE process involves varying the angle of incidence of an ion beam directed to an MTJ stack-up to etch a free layer smaller in size than a pinned layer for increased write and retention symmetry.

As shown in FIG. 4, each MTJ 400(1), 400(2), formed from an original MTJ stack-up, is disposed on a substrate 403 comprised of an inter-metal dielectric (IMD) layer 404 in this example. The IMD layer 404 contains metal layers 405(1), 405(2) for connectivity, that are disposed in the semiconductor logic 402. Note that only two MTJs 400(1), 400(2) are shown in the semiconductor logic 402 in FIG. 4, but there are typically more provided if the MTJs 400 are provided in a memory system as an example. Bottom electrodes (BE) 406(1), 406(2) are then disposed on and above the IMD layer 404 to provide for coupling to the respective MTJs 400(1), 400(2). For example, the bottom electrodes 406(1), 406(2) may be Tantalum (Ta), Tantalum Nitride (TaN), Titanium (Ti), Titanium Nitride (TiN), or Ruthenium (Ru) material, or alloy thereof as non-limiting examples. Pinned layers (PL) 408(1), 408(2) having pinned magnetic polarizations are disposed above and coupled to the bottom electrodes 406(1), 406(2). As non-limiting examples, the pinned layers 408(1), 408(2) may be a metal material, such as a ferromagnetic material or alloy. For example, the pinned layers 408(1), 408(2) may be a super-lattice multi-layer L10 alloy or rare-earth transition metal alloy with a ferromagnetic layer. Tunnel barriers 410(1), 410(2) are disposed above the respective pinned layers 408(1), 408(2). For example, the tunnel barriers 410(1), 410(2) may be a magnesium oxide (MgO) material to provide a dielectric layer. Free layers (FL) 412(1), 412(2) having free magnetic polarizations that are able to be changed based on voltage applied across the MTJs 400(1), 400(2) are disposed above the respective tunnel barriers 410(1), 410(2). To provide for greater write current symmetry in the MTJs 400(1), 400(2), the free layers 412(1), 412(2) are fabricated to be physically less in width than the respective pinned layers 408(1), 408(2) such that the magnetic fringe field in the pinned layers 408(1), 408(2) are located further away from the free layers 412(1), 412(2) to reduce magnetic coupling. Hard masks (HM) 414(1), 414(2) are disposed above the respective free layers 412(1), 412(2). As will be discussed in more detail below, the hard masks 414(1), 414(2) are provided in the MTJs 400(1), 400(2) to provide an etch mask when IBE the free layers 412(1), 412(2). Top electrodes (TE) 416(1), 416(2) are respectively disposed above and coupled to the hard masks 414(1), 414(2) to provide another electrode connection to the MTJs 400(1), 400(2).

With continuing reference to FIG. 4, if a passivation material, such as SiN for example, was disposed on the MTJs 400(1), 400(2) during fabrication, passivation layers 418(1), 418(2) may remain present after fabrication. The passivation layers 418(1), 418(2) are useful to prevent re-deposited matter during IBE processes from shorting the respective free layers 412(1), 412(2) and pinned layers 408(1), 408(2) across the tunnel barriers 410(1), 410(2). Also, an extremely low dielectric (ELK) material 420 may have been deposited around the MTJs 400(1), 400(2) during fabrication to provide further electrical isolation between the MTJs 400(1), 400(2) and their various metal layers discussed above.

With continuing reference to FIG. 4, data can be read and written to a respective MTJ 400(1), 400(2) in FIG. 4 by applying a specified voltage across the respective top electrode 416(1), 416(2) and bottom electrodes 406(1), 406(2). For write operations, taking MTJ 400(1) as an example, if the magnetic moment of the MTJ 400(1) is to be changed from anti-parallel (AP) to parallel (P), a write current ($I_{AP-P}$) flowing from the top electrode 416(1) to the bottom electrode 406(1) is generated. This induces a spin transfer torque (STT) at the free layer 412(1) to change the magnetic moment of the free layer 412(1) to P with respect to the pinned layer 408(1). If the magnetic moment is to be changed from P to AP, a current ($I_{P-AP}$) flowing from the bottom electrode 406(1) to the top electrode 416(1) is generated, which induces an STT at the free layer 412(1) to change the magnetic moment of the free layer 412(1) to AP with respect to the pinned layer 408(1). The free layer 412(1) is fabricated to be smaller in width than the pinned layer 408(1) so that the spin-transfer efficiency at both sides of the tunnel barrier 410(1) is ideally the same. Ideally, the same amount of write current (I) is required to switch the MTJ 400(1) from a P to AP state and from an AP to P state in a symmetrical manner. Write symmetry can reduce operational power consumption by the MTJ 400(1).

MTJ patterning or etching processes are used to fabricate the MTJs 400(1), 400(2) in FIG. 4 from an MTJ stack-up. If it is desired to fabricate the MTJs 400(1), 400(2) in FIG. 4 to provide for the free layers 412(1), 412(2) to be smaller in width than the respective pinned layers 408(1), 408(2), a suitable MTJ etching process must be used. Currently known methods for MTJ etching include IBE and chemical etching in a reactive ion etching (RIE) process. An RIE process can create damage zones around the perimeter of the MTJs 400(1), 400(2). Etching damage in the transition metals (i.e., the pinned layers 408(1), 408(2), the free layers 412(1), 412(2), the bottom electrodes 406(1), 406(2), and the top electrodes 416(1), 416(2)) in the MTJs 400(1), 400(2) can affect factors such as a tunnel magnetoresistance (TMR) ratio, switching current distribution, and energy bather (Eb) variations, which can result in poor MTJ performance. Also, as MTJs become scaled down, such as in high-density MRAMs, these damage zones limit the amount of downscaling.

Another method of MTJ etching involves ion beam etching (IBE). IBE may be used for etching materials that have tendencies to not react well to chemical etching. An IBE etching process can avoid or reduce damage zones over RIE processes, but no chemical component is involved to maintain lithography patterns and process flexibility. IBE of an MTJ, such as the MTJs 400(1), 400(2) in FIG. 4, involves directing a charged particle ion beam to an MTJ stack-up to etch layers in the MTJ stack-up to desired dimensions as the MTJ stack-up is rotated. The ion beam could be directed at a large angle of incidence towards an MTJ stack-up to etch the free layer to be smaller in width than the pinned layer and to minimize etch damage to the layers below the free layer and material re-deposition. However, during the IBE process, adjacent MTJs in the semiconductor logic cast a "shadow" on other MTJs from certain directions. Thus, an ion beam directed at an MTJ stack-up during an IBE fabrication process will be blocked from reaching the MTJ from certain directions as the MTJ stack-up is rotated during fabrication, thus causing the free layer to not be etched in as small a width as desired and/or having a substantially asymmetrical radius. Thus, this shadow-effect will result in greater magnetic coupling between the free layer and the pinned layer in the MTJ stack-up than would otherwise exist if the ion beam were not blocked from certain directions during the etching process, thus providing MTJ operational asymmetry.

In this regard, to etch fabricate MTJs, such as the MTJs 400(1), 400(2) in FIG. 4, to provide for their free layer to be fabricated to be smaller in width than their pinned layer, so that the spin-transfer efficiency at both sides of the tunnel barrier are substantially the same for operational symmetry, modified IBE fabrication methods can be provided. In aspects disclosed herein, these modified IBE fabrication methods involve shadow-effect compensated IBE of an MTJ. Shadow-effect compensated IBE of an MTJ can provide a desired reduced free layer sizing of the free layer and without asymmetrical radius issues for increased MTJ operational symmetry. Reducing the size of the free layer 412 during fabrication of an MTJ 400 allows less write current to write data to the MTJ 400, thus increasing write current operational margin of the MTJ 400.

Figure 5:
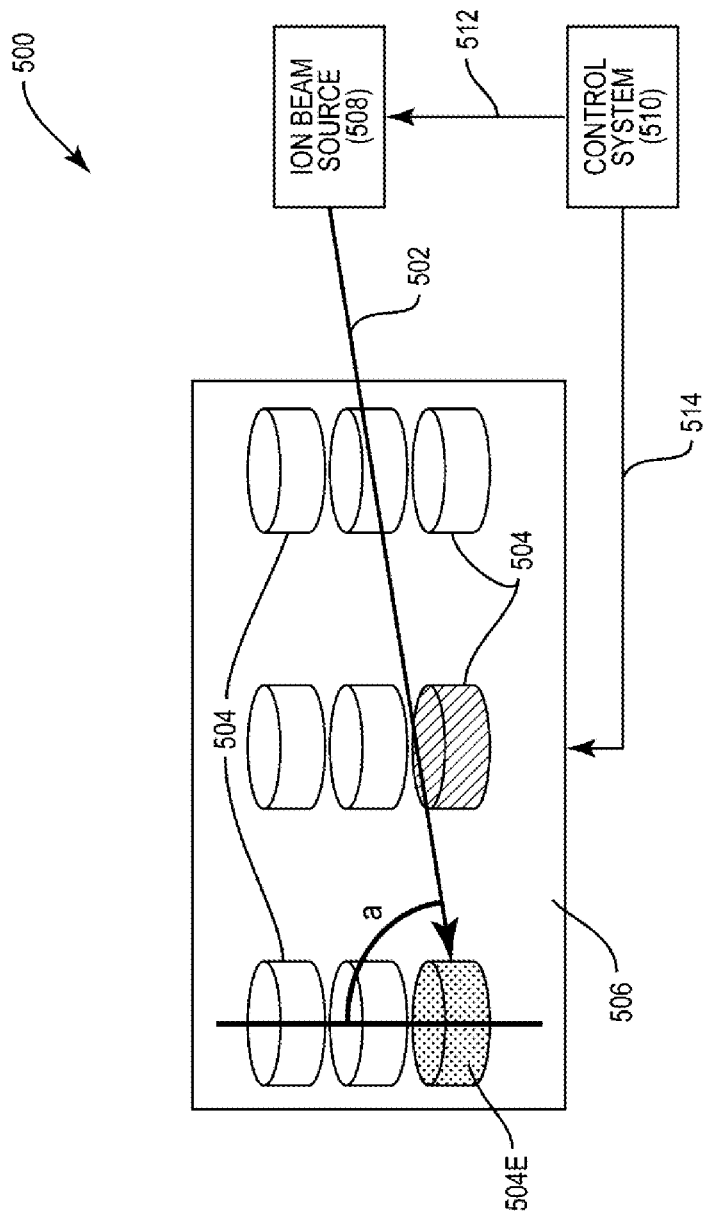
FIG. 5 is a schematic diagram of an IBE system configured to direct a shadow-effect compensated ion beam to MTJ stack-ups in semiconductor logic to etch the free layer smaller in size than the pinned layer in fabricated MTJs for increased write and retention symmetry.

In this regard, FIG. 5 is a schematic diagram of an IBE system 500 configured to direct a shadow-effect compensated ion beam 502 to MTJ stack-ups 504 in a semiconductor wafer 506 to etch their free layer smaller in size than their pinned layers for increased write and retention symmetry. During the IBE fabrication process, the shadow-effect compensated ion beam 502 is generated from an ion beam source 508. The ion beam source 508 is controlled by an internal or external control system 510 by a control signal 512 to be directed at an angle of incidence (a) towards an etched MTJ stack-up 504E disposed in the semiconductor wafer 506 to fabricate the free layer to be smaller in size than the pinned layer. To avoid an asymmetrical footing being fabricated in the free layer formed in the etched MTJ stack-up 504E due to a shadow-effect of the neighboring MTJ stack-ups 504 blocking the shadow-effect compensated ion beam 502 at certain angles. The shadow-effect compensated ion beam 502 directed at the etched MTJ stack-up 504E is shadow-effect compensated. As will be discussed by example in more detail below, the angle of incidence (a) of the shadow-effect compensated ion beam 502 directed at the etched MTJ stack-up 504E is varied as the semiconductor wafer 506 supporting the etched MTJ stack-up 504E is rotated during fabrication. The control system 510 may also be configured to control the rotation of the semiconductor wafer 506 via a rotation control signal 514 provided to an apparatus (not shown) that controls rotation of the semiconductor wafer 506. In this manner, as an example, the angle of incidence (a) of the shadow-effect compensated ion beam 502 can be controlled to be less steep when another MTJ stack-up 504 is in the directional line of the shadow-effect compensated ion beam 502 and the etched MTJ stack-up 504E being fabricated. Thus, the free layer can be etched more uniformly in the etched MTJ stack-up 504E to fabricate an MTJ while avoiding increased etching damage that would result from providing only a higher angle of incidence of the ion beam during etching without variation during rotation of the MTJ stack-ups 504.

To provide examples of shadow-effect compensated IBE of the MTJ stack-up 504 in the semiconductor wafer 506 in FIG. 5, FIGS. 6A-6E are provided. FIGS. 6A-6E are schematic diagrams illustrating directing of the shadow-effect compensated ion beam 502 in an IBE process towards MTJ stack-ups 504 on the semiconductor wafer 506 at varying exemplary angles of incidence as the semiconductor wafer 506 is rotated to etch the free layer smaller in size than the pinned layer for increased write and retention symmetry. FIG. 7 is a graph 700 illustrating the varying angles of incidence (a) of the shadow-effect compensated ion beam 502 as the semiconductor wafer 506 in FIG. 5 is rotated.

In this regard, as shown in FIG. 6A, the shadow-effect compensated ion beam 502 is directed to the etched MTJ stack-up 504E at an initial angle of incidence (a1). In this example, the free layer and hard mask widths in the MTJ stack-ups 504 are fifty (50) nanometers (nm), the pinned layer and tunnel barrier are one hundred fifty (150) nm in width, the pitch between the MTJ stack-ups 504 is three hundred (300) nm, and the hard mask thickness is one hundred (100) nm. In this example, FIG. 6A shows the rotational position of the semiconductor wafer 506 at 0 degrees. As shown in FIG. 6A, certain adjacent MTJ stack-ups 504B are in the direct path between the shadow-effect compensated ion beam 502 and the etched MTJ stack-up 504E. However, the ion beam source 508 (FIG. 5) can be controlled or the semiconductor wafer 506 tilted to set the angle of incidence (a1) of the shadow-effect compensated ion beam 502 to an angle that will not be obstructed by the MTJ stack-ups 504B. In this example, at a rotation angle of 0 degrees, the angle of incidence (a1) is approximately 56.3 degrees as shown in FIG. 7. In this manner, the shadow-effect compensated ion beam 502 can reach the etched MTJ-stack-up 504E in the desired manner to etch the free layer therein.

FIG. 6B illustrates the semiconductor wafer 506 at a rotational angle of approximately 26.6 degrees. Note that although the shadow-effect compensated ion beam 502 is shown as rotating about the semiconductor wafer 506 in FIG. 6B with respect to FIG. 6A, in this example, it is the semiconductor wafer 506 that is actually rotating with respect to the shadow-effect compensated ion beam 502. However, such is not limiting, and the ion beam source 508 (FIG. 5) could be configured to rotate the line of the shadow-effect compensated ion beam 502 about the semiconductor wafer 506. As shown in FIG. 6B, as the semiconductor wafer 506 is rotated, the shadow-effect on the etched MTJ stack-up 504E changes due to the different orientation of adjacent MTJ stack-ups 504B in the path of the shadow-effect compensated ion beam 502. In this manner, the angle of incidence (a1) of the shadow-effect compensated ion beam 502 may need to be varied to properly direct the shadow-effect compensated ion beam 502 to the etched MTJ stack-up 504E. In this regard, as shown in FIGS. 6B and 7, as the semiconductor wafer 506 is rotated from 0 degrees to 26.6 degrees about the shadow-effect compensated ion beam 502, the angle of incidence (a) of the shadow-effect compensated ion beam 502 is also varied from a1 to a2 between 56.3 degrees and 73.4 degrees.

Similarly, as the semiconductor wafer 506 continues to rotate beyond a rotational angle of 26.6 degrees through a 90 degree rotation, the angle of incidence (a) is also varied as shown in FIGS. 6C-6E and FIG. 7. Between the rotational angle of the semiconductor wafer 506 of approximately 27 degrees (e.g., 26.6 degrees) and approximately 45 degrees, the angle of incidence (a) of the shadow-effect compensated ion beam 502 is also varied from a2 to a3 between 73.4 degrees and approximately 65 degrees (e.g., 64.8 degrees), as shown in FIGS. 6C and 7. Between the rotational angle of the semiconductor wafer 506 of approximately 45 degrees and approximately 63 degrees (e.g., 63.4 degrees), the angle of incidence (a) of the shadow-effect compensated ion beam 502 is also varied from a3 to a4 between approximately 64 degrees (e.g., 64.8 degrees) and approximately 74 degrees (e.g., 73.4 degrees), as shown in FIGS. 6D and 7. Between the rotational angle of the semiconductor wafer 506 of 63.4 degrees and 90 degrees, the angle of incidence (a) of the shadow-effect compensated ion beam 502 is also varied from a4 to a5 between approximately 74 degrees (e.g., 73.4 degrees) and approximately 56 degrees (e.g., 56.3 degrees), as shown in FIGS. 6E and 7. Because of the grid-patterned arrangement of the MTJ stack-ups 504 in the semiconductor wafer 506, the angles of incidence (a) of the shadow-effect compensated ion beam 502 for rotational angles of the semiconductor wafer 506 are the same in this example between 90 degrees ($\pi/2$). −180 degrees ($\pi$), 180 degrees ($\pi$). −270 degrees ($3/2\pi$), and 270 degrees ($3/2\pi$) to 360 degrees ($2\pi$).

Figure 8A:
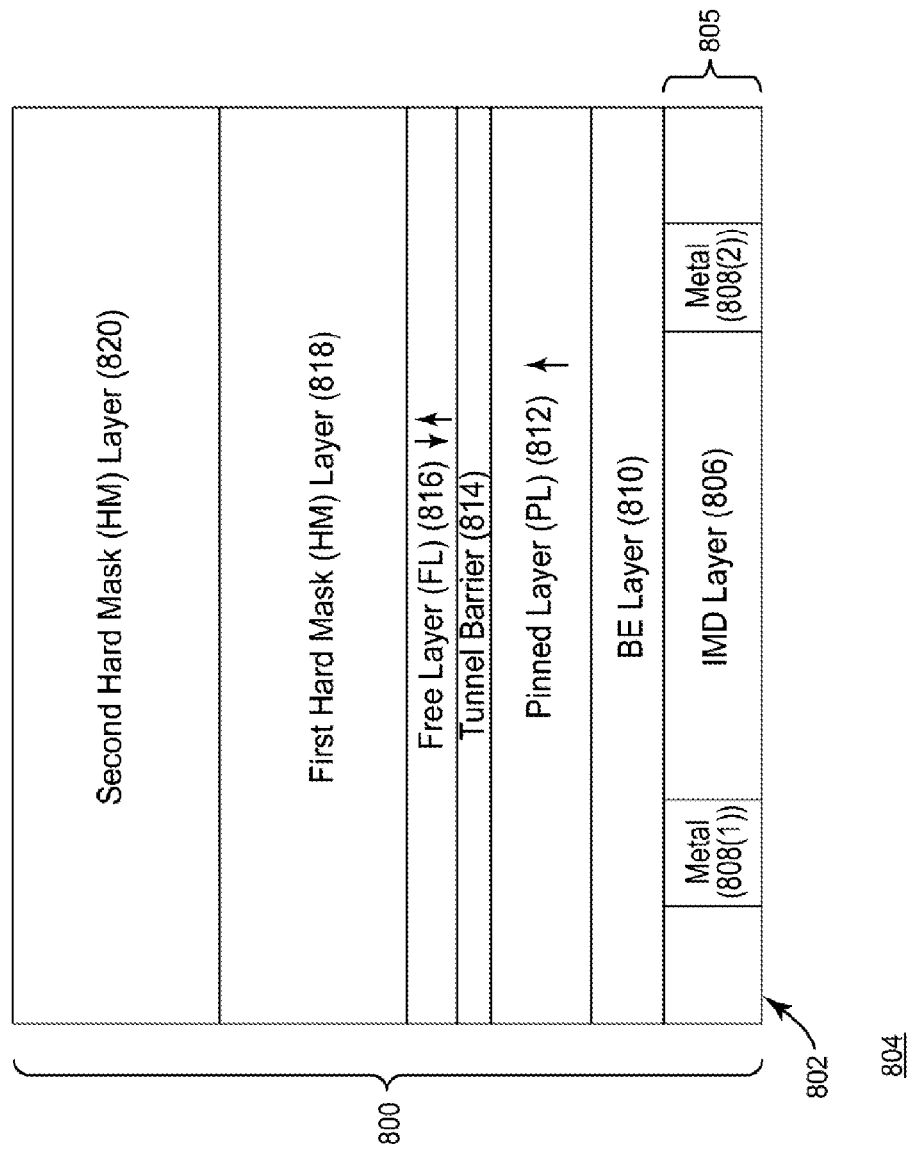
FIGS. 8A-8D illustrate schematic diagrams of an exemplary MTJ stack-up in a semiconductor wafer as exemplary etching fabrication steps are performed on the MTJ stack-up, including a shadow-effect compensated IBE process to etch both a hard mask and a free layer in the MTJ.

Now that examples of shadow-effect compensated IBE of an MTJ stack-up have been discussed, exemplary etching processes are now discussed that involve shadow-effect compensated IBE of an MTJ stack-up in a semiconductor wafer to etch a free layer smaller in size than a pinned layer for increased write and retention symmetry. In this regard, FIGS. 8A-8D illustrate schematic diagrams of an exemplary MTJ stack-up 800 in semiconductor logic as exemplary etching fabrication steps are performed, including a shadow-effect compensated IBE process. As will be discussed in more detail below, the etching process of the MTJ stack-up 800 in FIGS. 8A-8D involves a shadow-effect compensated IBE process to etch both the hard mask and free layer in the MTJ stack-up 800. In this regard, with reference to FIG. 8A, the MTJ-stack up 800 is provided. The MTJ stack-up 800 consists of deposited or formed layers on semiconductor logic 802 in a semiconductor wafer 804 before etching processes are performed. The MTJ stack-up 800 can subsequently be etched on the semiconductor wafer 804 to form MTJs. As shown in FIG. 8A, an upper portion 805 of the semiconductor logic 802 in this example is comprised of an IMD layer 806. The IMD layer 806 in FIG. 8A shows separate metal layers 808(1), 808(2) to provide connectivity for separate etched MTJs from the MTJ stack-up 800.

With continuing reference to FIG. 8A, the MTJ stack-up 800 includes a bottom electrode (BE) layer 810 disposed above the IMD layer 806 and a pinned layer (PL) 812 having a pinned magnetic polarization disposed above the bottom electrode layer 810. As non-limiting examples, the pinned layer 812 may be a metal material, such as a ferromagnetic material or alloy. For example, the pinned layer 812 may be a superlattice multi-layer L10 alloy or rare-earth transition metal alloy with a ferromagnetic layer. A tunnel barrier 814 is disposed above the pinned layer 812. A free layer (FL) 816 having magnetization with uniaxial anisotropy that is able to be changed is disposed above the tunnel barrier 814. A first hard mask (HM) layer 818 is disposed above the free layer 816. The hard mask layer 818 may be a Tantalum (Ta), Tantalum Nitride (TaN), Titanium (Ti), Titanium Nitride (TiN), or Ruthenium (Ru) material, or alloy thereof as non-limiting examples. A second hard mask (HM) layer 820 is disposed above the first hard mask layer 818. The second hard mask layer 820 may be a SiN, Silicon Oxide (SiO2), or Silicon Oxynitride (SiOxNy) material, as non-limiting examples. The second hard mask layer 820 may be provided of the same or larger thickness than the first hard mask layer 818.

Figure 8B:
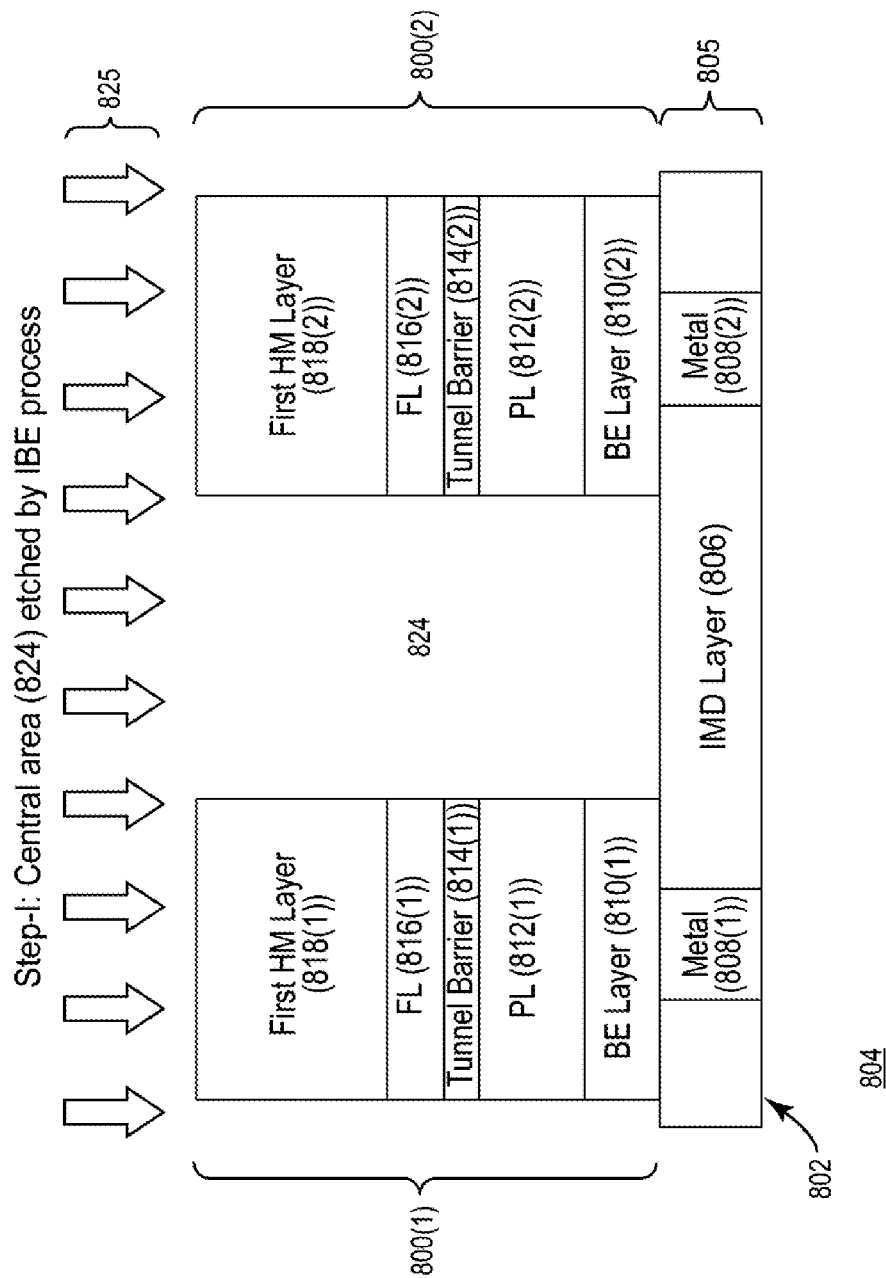

As shown in FIG. 8B, in a first processing step, it may be desired to first etch away a large central area 824 of the MTJ stack-up 800 to prepare to fabricate multiple MTJs. In FIG. 8B, the single large central area 824 etched away from the MTJ stack-up 800 is shown to illustrate two (2) MTJ stack-ups 800(1), 800(2) to be fabricated. An ion beam 825 is directed to the MTJ stack-up 800 in FIG. 8A to etch away the central area 824 in the MTJ stack-up 800 in an IBE process. The ion beam 825 could be the shadow-effect compensated ion beam 502 from the ion beam source 508 in FIG. 5 configured to be directed orthogonal to the MTJ-stackup 800. The second hard mask layer 820 is etched away and protects areas of the MTJ stack-up 800 such that two MTJ stack-ups 800(1), 800(2) are formed. Thus, as shown in FIG. 8B, each MTJ stack-up 800(1), 800(2) will have its own respective separate bottom electrode 810(1), 810(2), pinned layer 812(1), 812(2), tunnel barrier 814(1), 814(2), free layer 816(1), 816(2), and first hard mask layer 818(1), 818(2) after the central area 824 is etched.

Figure 8C:
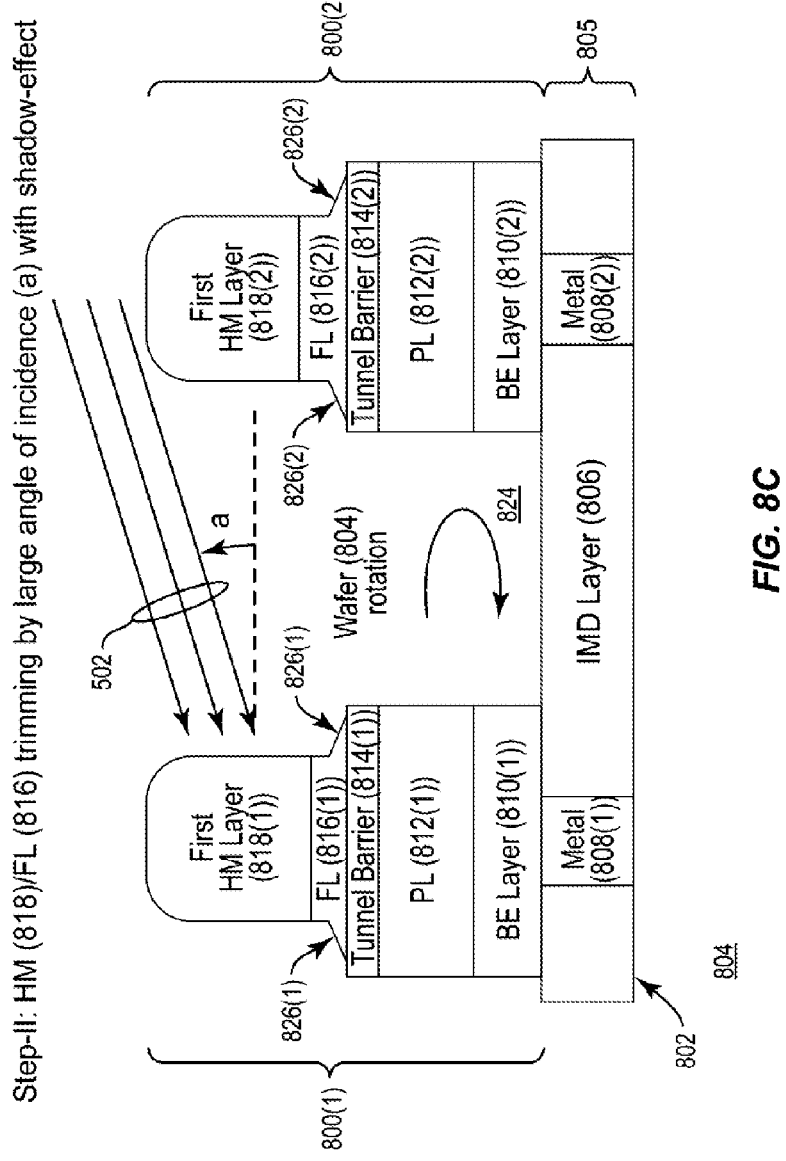
Figure 8D:
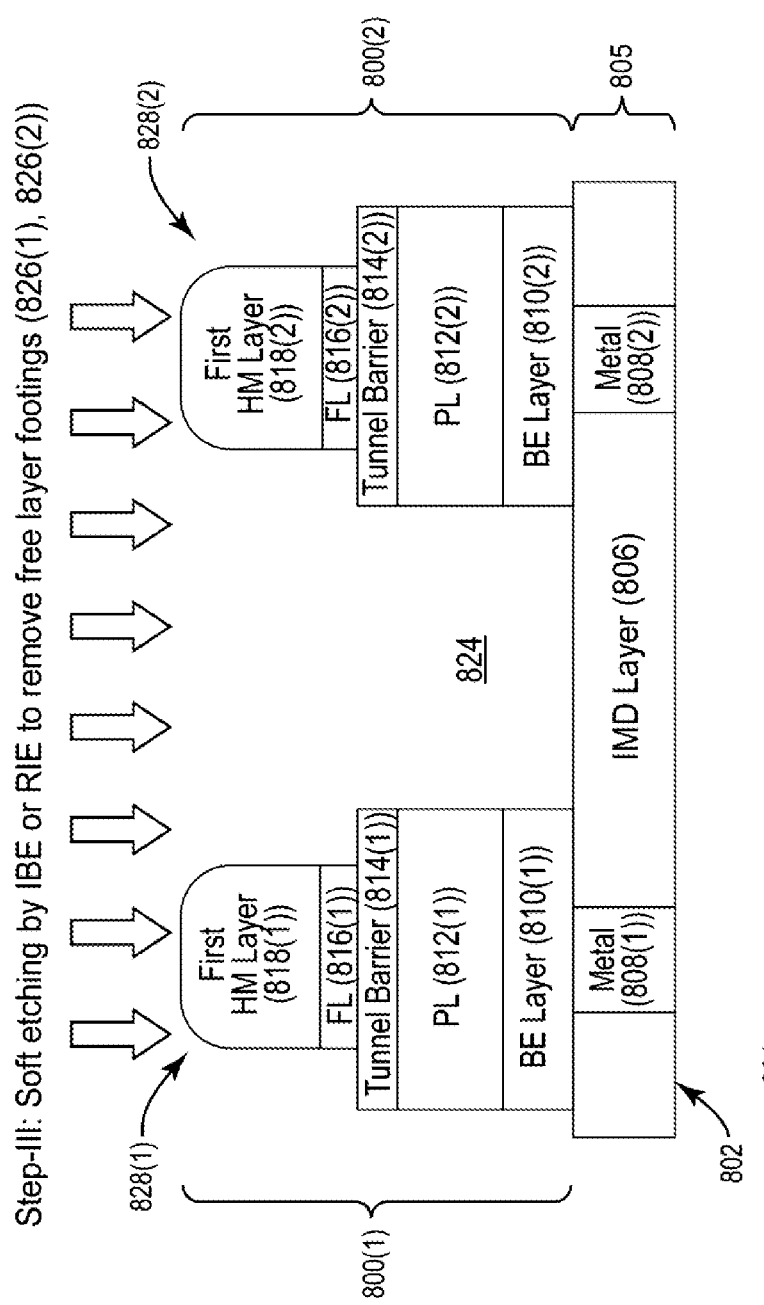

Next, with reference to FIG. 8C, to provide for greater write current symmetry in the fabricated MTJs that will result from the etched MTJ stack-ups 800(1), 800(2) of FIG. 8B, the free layers 816(1), 816(2) are fabricated to be physically less in width than the respective pinned layers 812(1), 812(2) such that the magnetic fringe field in the pinned layers 812(1), 812(2) are located further away from the free layers 816(1), 816(2) to reduce magnetic coupling. In this regard, the shadow-effect compensated ion beam 502 (FIG. 5) is directed to the first hard mask layer 818(1) and free layer 816(1) of the MTJ stack-up 800(1) in the example of the MTJ stack-up 800(1) being etched in a second IBE process. The first hard mask layer 818(1) is provided to protect the portions of the free layer 816(1) that are not desired to be etched. The angle of incidence (a) of the shadow-effect compensated ion beam 502 is controlled to be larger to compensate for the shadow-effect of neighboring MTJ stacks 800 in the semiconductor wafer 804 in the path of the shadow-effect compensated ion beam 502 directed to the etched MTJ stack-up 800(1). As previously discussed above with regard to FIGS. 5-7, the angle of incidence of the shadow-effect compensated ion beam 502 is varied as the semiconductor wafer 804 is rotated to provide for an etched free layer 816(1) to be physically less in width than the pinned layer 812(1) in a desired manner. The MTJ stack-up 800(2) can be etched in this manner, as shown in FIG. 8C. Resulting MTJs 828(1), 828(2) from the shadow-effect compensated IBE process performed in FIG. 8C is shown in FIG. 8D. The MTJs 828(1), 828(2) could be provided in MRAM bit cells as a replacement for the STT-MTJ 100 in FIG. 1, as an example, to provide MRAM bit cells having increased write and retention symmetry. The MRAM bit cells could be provided in an MRAM array to provide an MRAM system as an example.

With reference back to FIG. 8C, note that directing the shadow-effect compensated ion beam 502 at the high angle of incidence (a) to the first hard mask layer 818(1) and the free layer 816(1), such that the tunnel barrier 814(1) and pinned layer 812(1) are not damaged or substantially damaged, will cause a free layer footing 826(1) to remain at the bottom of the free layer 816(1) (and likewise a free layer footing 826(2) in the free layer 816(2)). Thus, it may be desired to remove or reduce the size of the free layer footings 826(1), 826(2), because the free layer footings 826(1), 826(2) contribute the magnetic coupling of the respective free layers 816(1), 816(2) to their respective pinned layers 812(1), 812(2), which can affect the goal of achieving symmetrical write and retention operations in the resulting fabricated MTJs.

In this regard, a third processing step illustrated in FIG. 8D, additional soft etching can be performed to remove or reduce the size of the free layer footings 826(1), 826(1). Soft etching is employed to retain the first hard mask layer 818(1), 818(2) to protect the layers underneath in the MTJ stack-ups 800(1), 800(2). This additional etching may also assist in providing a more substantially symmetrically radiused free layer 816(1), 816(2) to assist in providing symmetrical write and retention operations in the resulting fabricated MTJs 828(1), 828(2). This additional etching can be another IBE process or a reactive ion etching (RIE) process, as non-limiting examples. This additional etching process does not have to involve a shadow-effect compensated ion beam 502 and does not have to involve a non-normal angle of incidence of the ion beam. The tunnel barriers 814(1), 814(2) act as etch stops during this additional etching process. The first hard mask layers 818(1), 818(2) protect the portion of the free layers 816(1), 816(2) as desired to be retained to achieve operational symmetry.

Figure 9A:
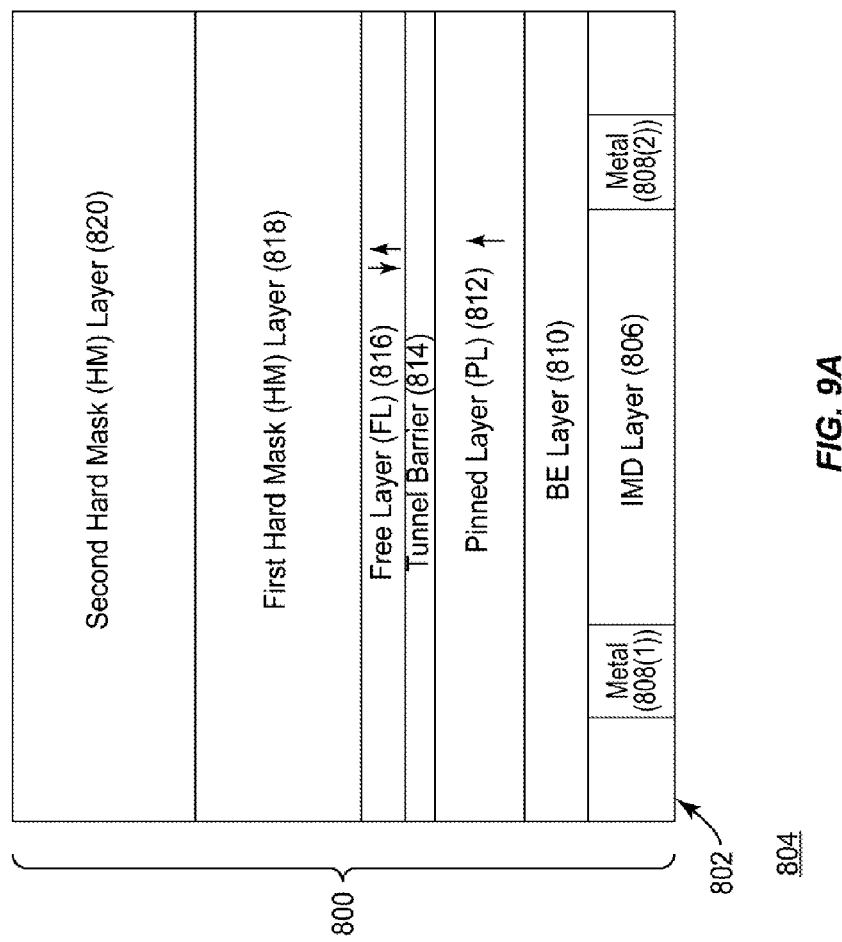
FIGS. 9A-9D illustrate schematic diagrams of an exemplary MTJ stack-up in a semiconductor wafer as exemplary etching fabrication steps are performed on the MTJ stack-up, but also employing a passivation layer deposition to protect the pinned layers and tunnel barriers.
Figure 9B:
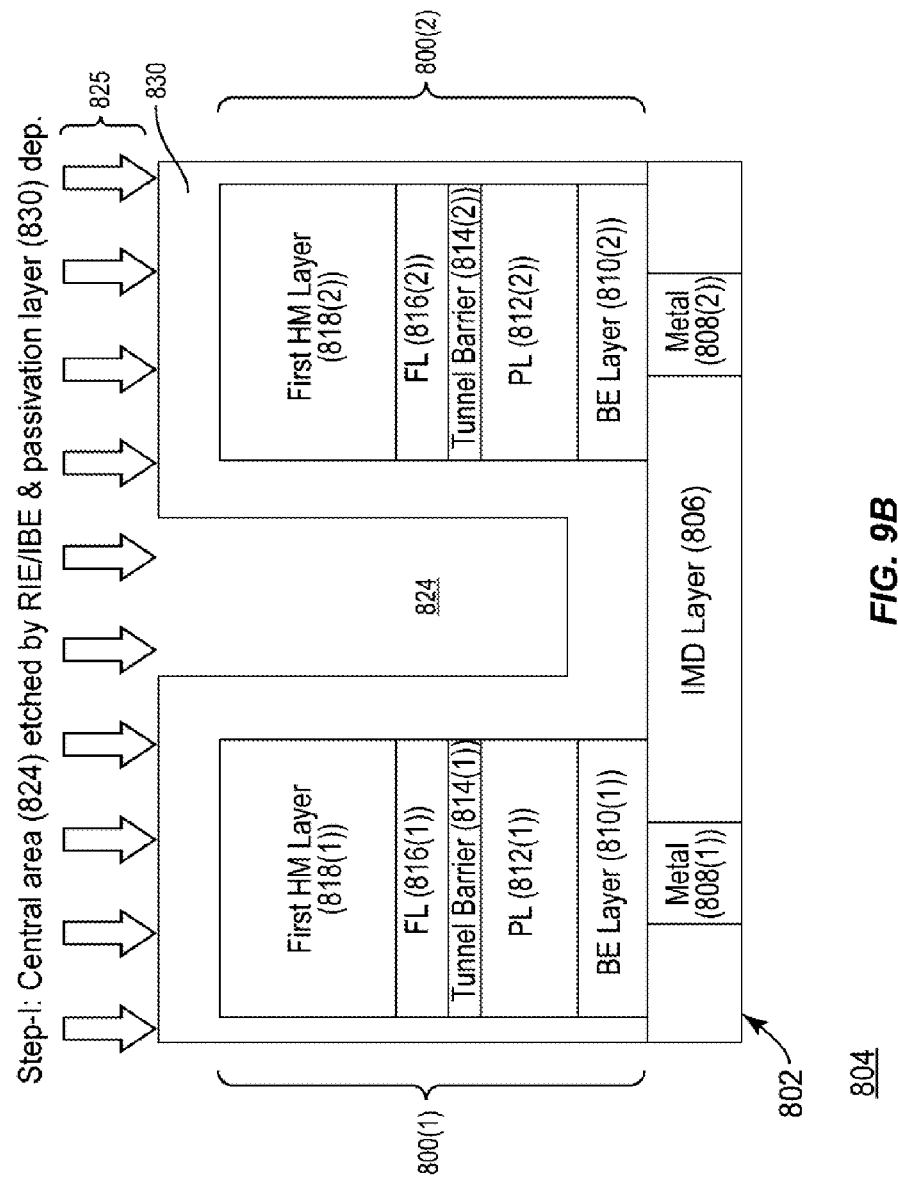
Figure 9C:
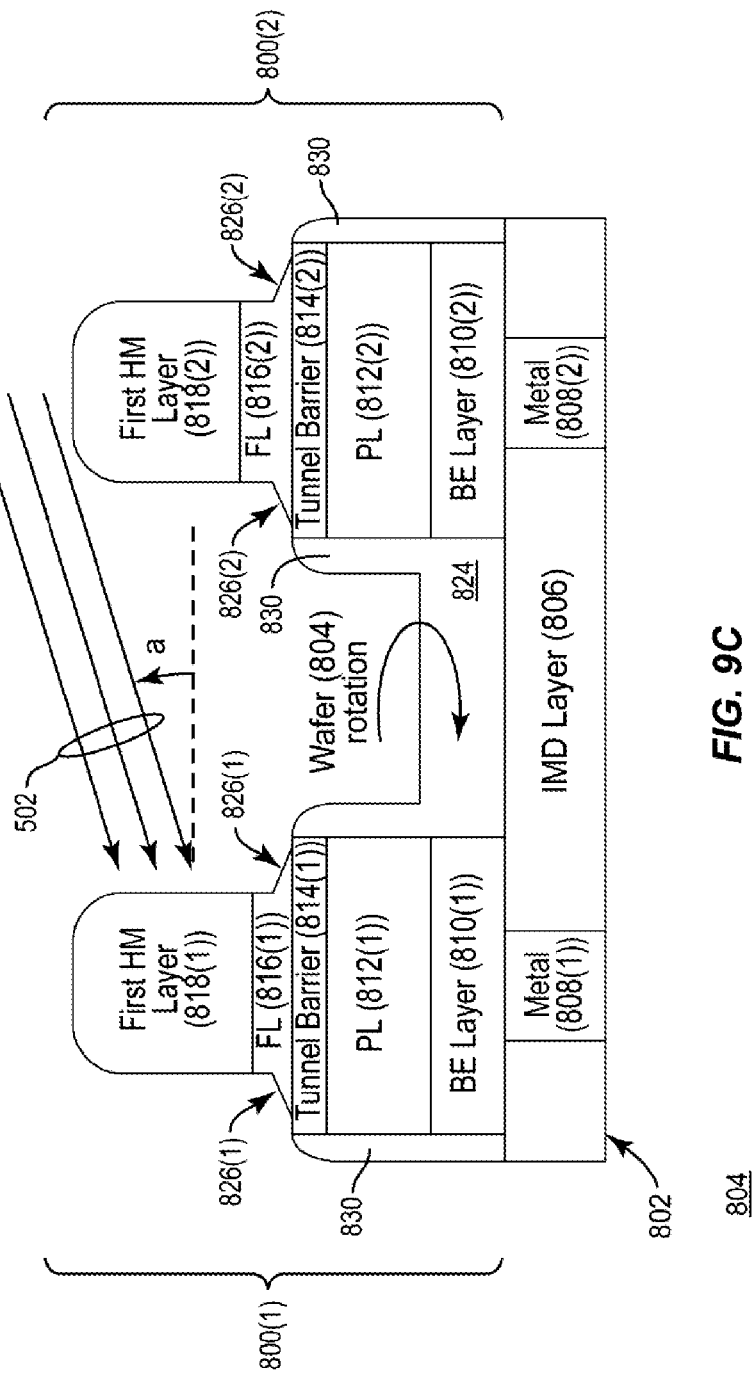
Figure 9D:
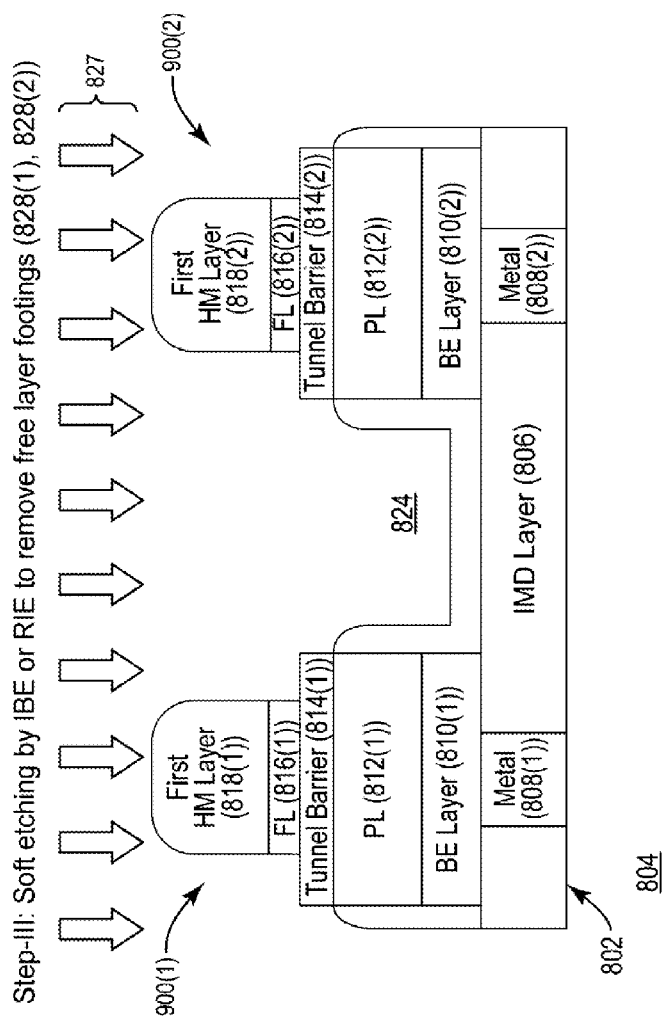

It may be desired to provide a passivation layer around the sides of the pinned layers 812(1), 812(2) and the tunnel barriers 814(1), 814(2) in the fabricated MTJs 828(1), 828(2) in FIG. 8D to avoid re-deposited etched material from shorting the free layers 816(1), 816(2) to their respective pinned layers 812(1), 812(2). In this regard, FIGS. 9A-9D illustrate schematic diagrams of the exemplary MTJ stack-ups 800(1), 800(2) in FIGS. 8A-8D, except that a passivation layer is provided as part of the etching process. In this regard, FIG. 9A illustrates an MTJ stack-up 800 like that illustrated in FIG. 8A. As illustrated in FIG. 9B, after the central area 824 is etched away according to the process in FIG. 8B to form two MTJ stack-ups 800(1), 800(2), a passivation layer 830 is disposed over the MTJ stack-ups 800(1), 800(2) and the IMD layer 806 as part of the first etching step. Then, as illustrated in FIG. 9C, the shadow-effect compensated IBE process is performed on the MTJ stack-ups 800(1), 800(2) just as provided in FIG. 8C. However, as shown in FIG. 9C, portions of the passivation layer 830 remain unremoved from the shadow-effect compensated IBE process remaining around the tunnel barriers 814(1), 814(2), the pinned layers 812(1), 812(2), the bottom electrodes 810(1), 810(2) and above the IMD layer 806 in the central area 824. The optional third step of performing additional etching to remove or reduce the size of the free layer footings 826(1), 826(2) in FIG. 8D can be performed on the resulting MTJ stack-ups 800(1), 800(2) with the remaining passivation layer 830, as shown in FIG. 9D, to provide resulting fabricated MTJs 900(1), 900(2).

In the shadow-effect compensated IBE processes described above with regard to FIGS. 8A-9D, the shadow-effect compensated ion beam 502 (FIG. 5) is directed towards both the hard mask layers 818(1), 818(2) and the free layers 816(1), 816(2) to etch both. However, it may be desired to only etch the hard mask during the shadow-effect compensated IBE process, and then reduce the size of the free layers 816(1), 816(2) during a subsequent soft etching process, as shown in FIGS. 8D and 9D and discussed above.

Figure 10A:
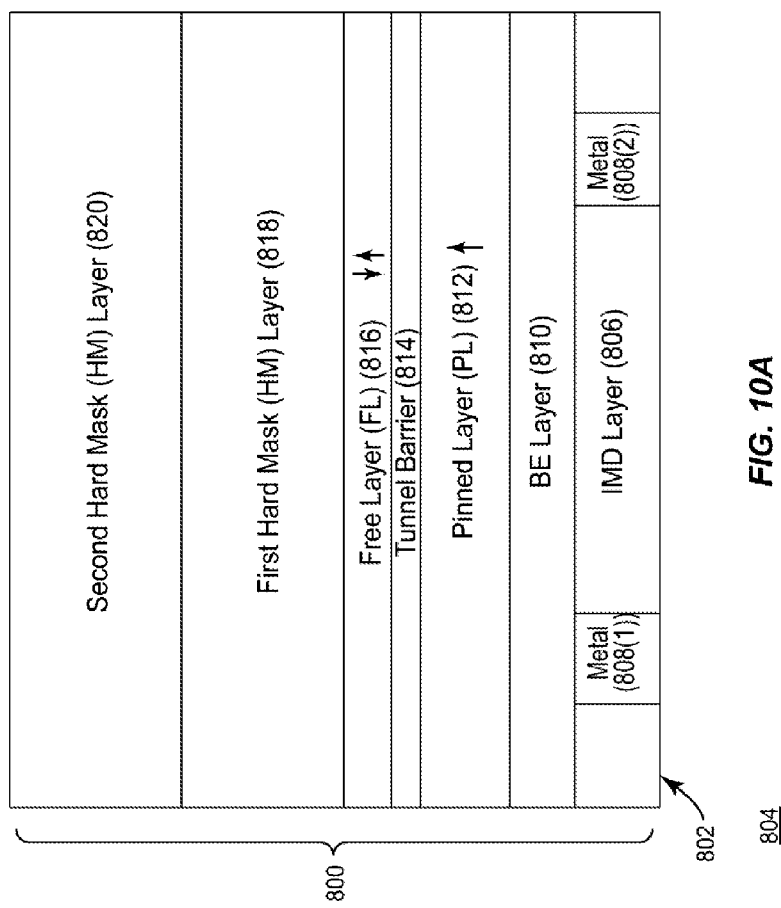
FIGS. 10A-10D illustrate schematic diagrams of an exemplary MTJ stack-up in a semiconductor wafer as exemplary etching fabrication steps are performed on the MTJ stack-up, including a shadow-effect compensated IBE process to etch a hard mask and a second etching process to etch a free layer in the MTJ.
Figure 10B:
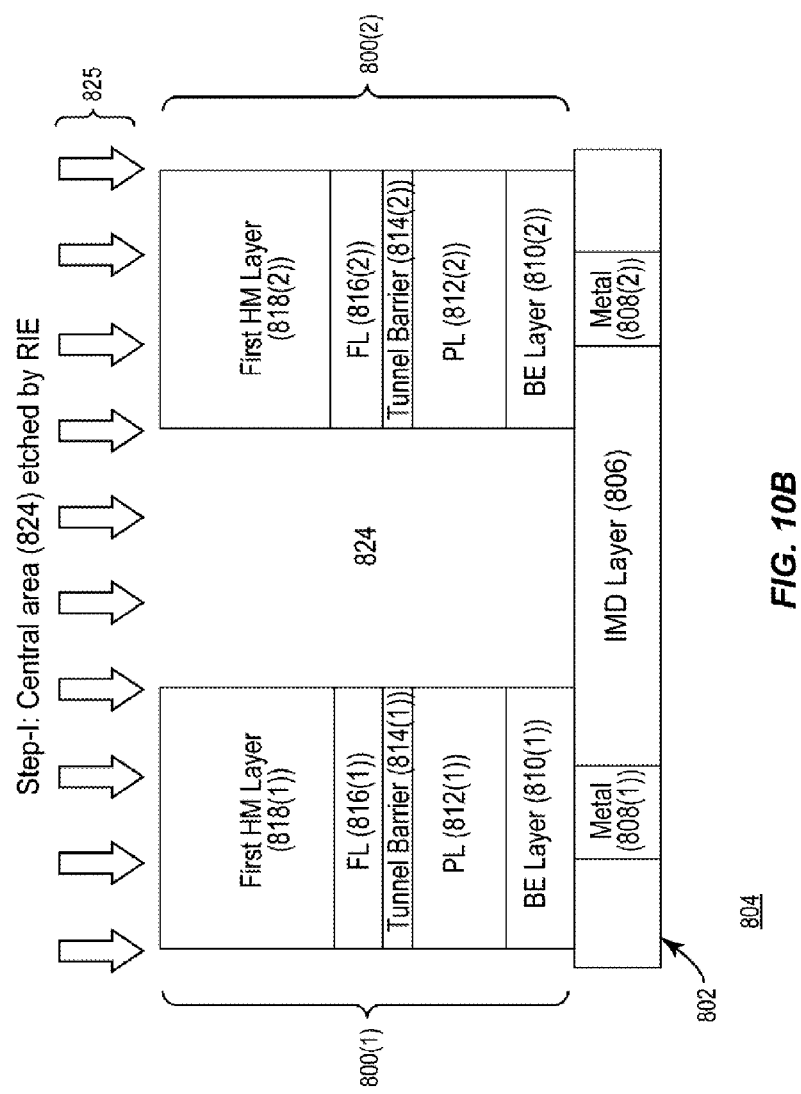
Figure 10C:
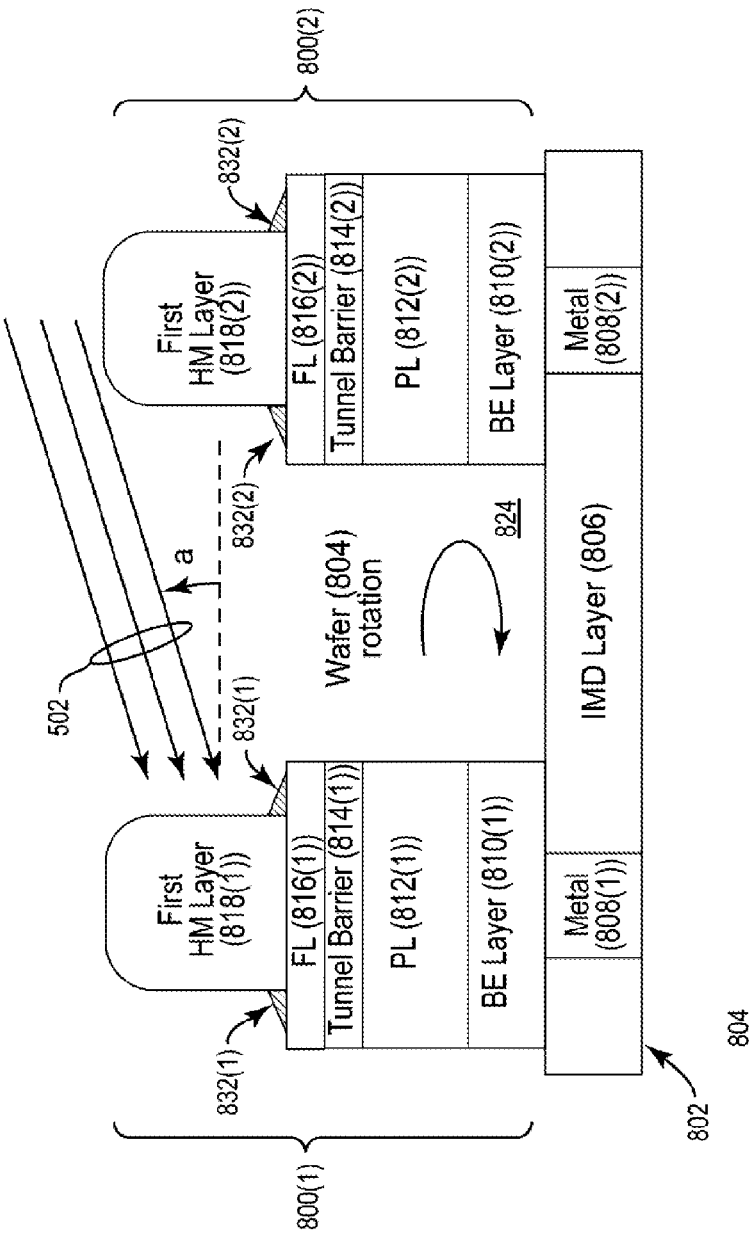
Figure 10D:
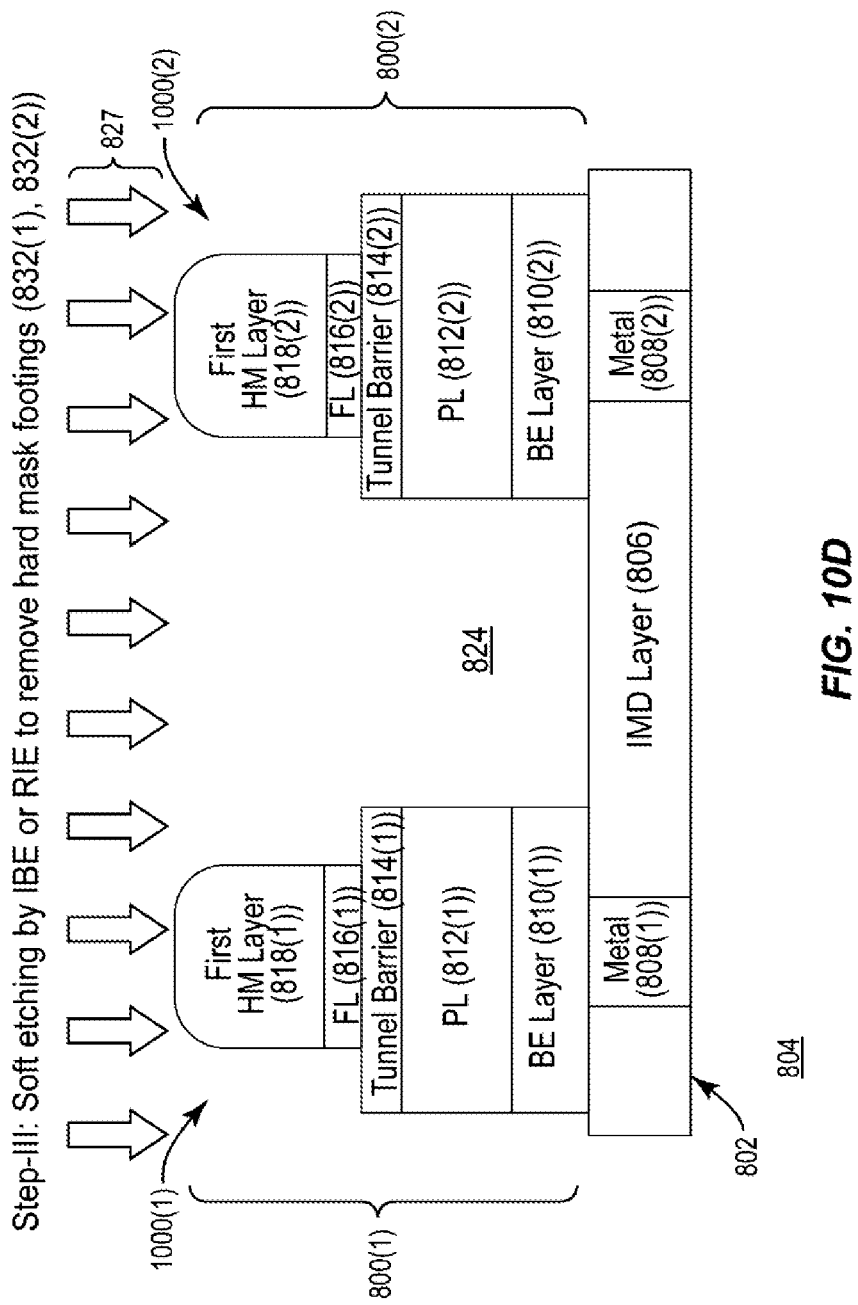

In this regard, FIG. 10A provides an MTJ stack-up 800 like that illustrated in FIG. 8A. As illustrated in FIG. 10B, the central area 824 is etched away according to the process in FIG. 8B to form two MTJ stack-ups 800(1), 800(2). Although not illustrated in FIG. 10B, an optional passivation layer, like the passivation layer 830 in FIG. 9B, can be disposed over the MTJ stack-ups 800(1), 800(2) and the IMD layer 806 as part of the first etching step, if desired. Then, as illustrated in FIG. 10C, the shadow-effect compensated IBE process is performed on the MTJ stack-ups 800(1), 800(2) like provided in FIG. 8C, except that only the hard mask layers 818(1), 818(1) are etched. This causes hard mask layer footings 832(1), 832(2) to remain as a result of the shadow-effect compensated IBE process. Thus, in a third step shown in FIG. 10D, additional soft etching can be performed using either IBE or RIE processes, as examples, to remove or reduce the size of the hard mask layer footings 832(1), 832(2) to form resulting MTJs 1000(1), 1000(2).

The shadow-effect compensated fabrication of MTJ elements to provide reduced free layer sizing for enhanced MTJ operational margin according to aspects disclosed herein, may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 11:
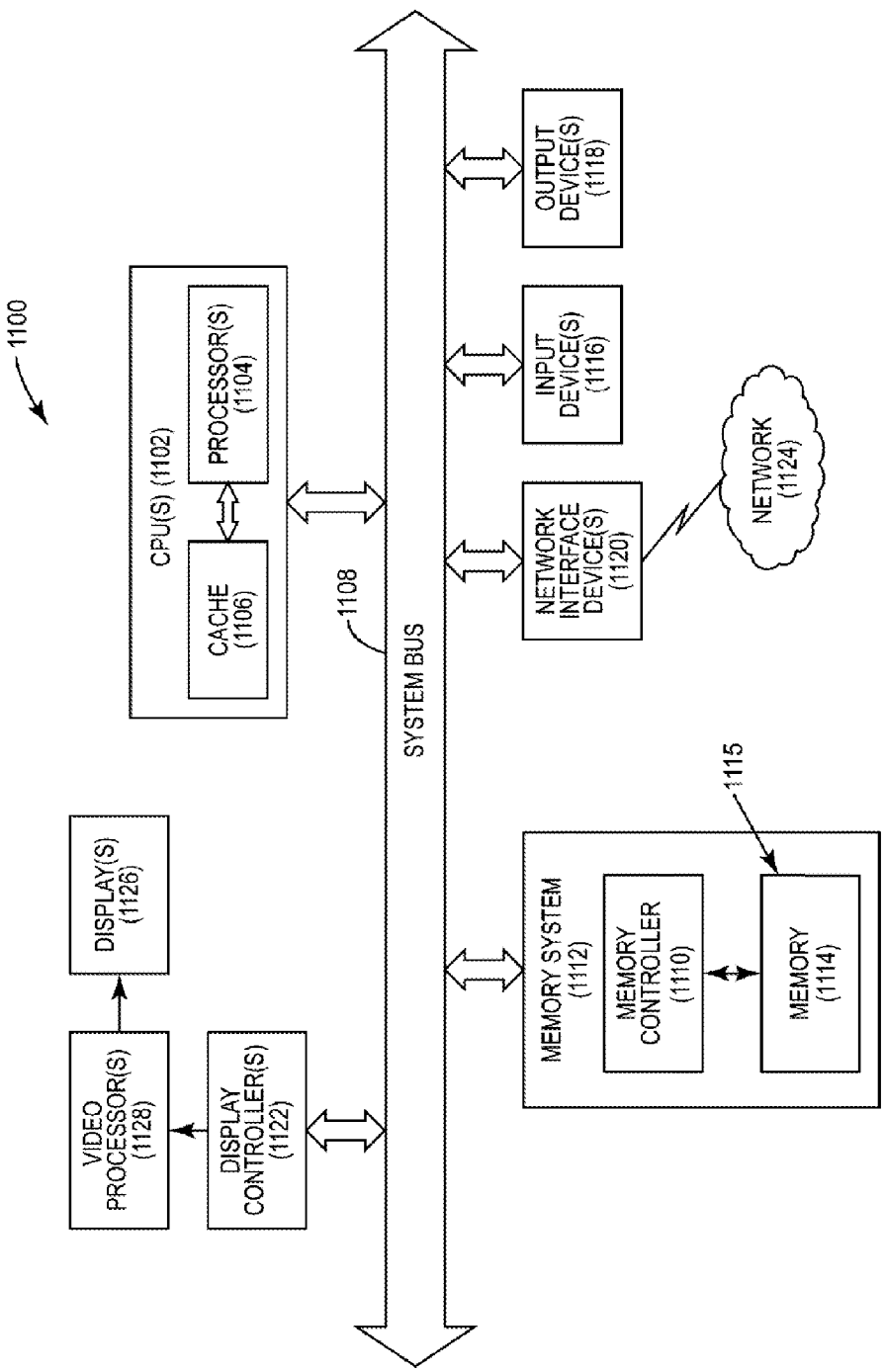
FIG. 11 is a block diagram of an exemplary processor-based system that can include an MRAM employing the MTJs disclosed herein fabricated using a shadow-effect compensated IBE process to provide a smaller free layer than a pinned layer for increased write and retention symmetry.

In this regard, FIG. 11 illustrates an example of a processor-based system 1100 that can employ shadow-effect compensated fabricated MTJ semiconductor elements according to any of the particular aspects discussed above. In this example, the processor-based system 1100 includes one or more central processing units (CPUs) 1102, each including one or more processors 1104. The CPU(s) 1102 may have cache memory 1106 coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 in a memory system 1112 as an example of a slave device. Although not illustrated in FIG. 11, multiple system buses 1108 could be provided, wherein each system bus 1108 constitutes a different fabric. In this example, the memory controller 1110 is configured to provide memory access requests to memory 1114 in the memory system 1112. The memory 1114 can include memory bit cells 1115 that include MTJs that were shadow-effect compensated fabricated. For example, the memory 1114 can be an MRAM that includes the memory bit cells 1115 that include MTJs that were shadow-effect compensated fabricated.

Other devices can be connected to the system bus 1108. As illustrated in FIG. 11, these devices can include the memory system 1112, one or more input devices 1116, one or more output devices 1118, one or more network interface devices 1120, and one or more display controllers 1122, as examples. The input device(s) 1116 can include any type of input device, including but not limited to input keys, switches, voice processors, etc. The output device(s) 1118 can include any type of output device, including but not limited to audio, video, other visual indicators, etc. The network interface device(s) 1120 can be any devices configured to allow exchange of data to and from a network 1124. The network 1124 can be any type of network, including but not limited to a wired or wireless network, a private or public network, a local area network (LAN), a wide local area network (WLAN), and the Internet. The network interface device(s) 1120 can be configured to support any type of communications protocol desired.

The CPU(s) 1102 may also be configured to access the display controller(s) 1122 over the system bus 1108 to control information sent to one or more displays 1126. The display controller(s) 1122 sends information to the display(s) 1126 to be displayed via one or more video processors 1128, which process the information to be displayed into a format suitable for the display(s) 1126. The display(s) 1126 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method of fabricating a magnetic tunnel junction (MTJ) in a semiconductor wafer, comprising:
    providing an MTJ stack-up on a substrate in the semiconductor wafer, the MTJ stack-up comprising a pinned layer disposed above a bottom electrode on the substrate, a free layer disposed above the pinned layer, a tunnel barrier disposed between the pinned layer and the free layer, and a hard mask disposed above the free layer;
    forming at least one MTJ from the MTJ stack-up; and
    etching the hard mask in the MTJ stack-up to fabricate the free layer smaller in width than the pinned layer in the MTJ stack-up, comprising:
        rotating the semiconductor wafer to angularly rotate the MTJ stack-up with reference to an ion beam source; and
        during the rotating of the semiconductor wafer for a revolution:
            directing an ion beam from the ion beam source at a first angle of incidence towards the hard mask when the MTJ stack-up is disposed at a first rotational angle of the revolution with reference to the ion beam source; and
            directing the ion beam from the ion beam source at a second angle of incidence in the revolution different from the first angle of incidence towards the hard mask when the MTJ stack-up is disposed at a second rotational angle of the revolution different from the first rotational angle with reference to the ion beam source.

2. The method of claim 1, comprising:
    directing the ion beam from the ion beam source at the first angle of incidence between approximately 55 degrees and 75 degrees towards the hard mask when the MTJ stack-up is disposed at the first rotational angle of the revolution with reference to the ion beam source; and
    directing the ion beam from the ion beam source at the second angle of incidence between approximately 55 degrees and 75 degrees in the revolution different from the first angle of incidence towards the hard mask when the MTJ stack-up is disposed at the second rotational angle of the revolution different from the first rotational angle with reference to the ion beam source.

3. The method of claim 2, comprising:
    directing the ion beam from the ion beam source at the first angle of incidence between approximately 56.3 degrees and 73.5 degrees towards the hard mask when the MTJ stack-up is disposed at the first rotational angle of the revolution with reference to the ion beam source.

4. The method of claim 2, comprising:
    directing the ion beam from the ion beam source at the first angle of incidence of the ion beam source between approximately 55 degrees and 75 degrees towards the hard mask when the MTJ stack-up is disposed at the first rotational angle between approximately 0 degrees and 26 degrees of the revolution with reference to the ion beam source.

5. The method of claim 2, comprising:
    directing the ion beam from the ion beam source at the first angle of incidence of the ion beam source between approximately 75 degrees and 64 degrees towards the hard mask when the MTJ stack-up is disposed at the first rotational angle between approximately 27 degrees and 45 degrees of the revolution with reference to the ion beam source.

6. The method of claim 1, further comprising not etching the pinned layer during the directing of the ion beam at the first angle of incidence towards the hard mask, and the directing of the ion beam at the second angle of incidence towards the hard mask.

7. The method of claim 1, further comprising substantially removing a free layer footing formed in the free layer.

8. The method of claim 1, further comprising directing an ion beam towards the MTJ stack-up to etch away a central area of the MTJ stack-up to form at least two adjacent MTJs between an etched away central area of the MTJ stack-up.

9. The method of claim 1, further comprising trimming a free layer footing formed in the free layer to an etch stop formed by the tunnel barrier.

10. The method of claim 9, wherein trimming the free layer footing comprises directing an ion beam substantially normal to the hard mask and to the etch stop formed by the tunnel barrier.

11. The method of claim 9, wherein trimming the free layer footing comprises directing a reactive ion etch (RIE) substantially normal to the hard mask and to the etch stop formed by the tunnel barrier.

12. The method of claim 1, further comprising disposing a passivation layer on the MTJ stack-up before directing the ion beam from the ion beam source at the first angle of incidence towards the hard mask when the MTJ stack-up is disposed at the first rotational angle.

13. The method of claim 12, wherein directing the ion beam from the ion beam source at the first angle of incidence towards the hard mask when the MTJ stack-up is disposed at the first rotational angle etches a portion of the passivation layer adjacent to the hard mask and the free layer.

14. The method of claim 1, wherein directing the ion beam at the first angle of incidence comprises directing the ion beam from the ion beam source at the first angle of incidence towards the hard mask and the free layer when the MTJ stack-up is disposed at the first rotational angle to etch the hard mask and the free layer in the MTJ stack-up, wherein a free layer footing is formed in the free layer.

15. The method of claim 1, wherein directing the ion beam comprises directing the ion beam from the ion beam source at the first angle of incidence towards the hard mask when the MTJ stack-up is disposed at the first rotational angle to etch only the hard mask in the MTJ stack-up.

16. A magnetic tunnel junction (MTJ) comprising:
a first electrode;
a second electrode;
a pinned layer of a pinned layer width disposed between the first electrode and the second electrode;
a free layer between the first electrode and the pinned layer, the free layer having a free layer width smaller than the pinned layer width;
a tunnel barrier disposed between the pinned layer and the free layer; and
a shadow-effect compensated ion beam etched hard mask disposed above the free layer between the free layer and the first electrode.

17. The MTJ of claim 16, wherein the free layer is comprised of a shadow-effect compensated ion beam etched free layer.

18. The MTJ of claim 16, wherein the shadow-effect compensated ion beam etched hard mask is an only shadow-effect compensated ion beam etched layer.

19. The MTJ of claim 16, wherein the free layer is substantially free of a free layer footing.

20. The MTJ of claim 16, wherein the free layer has a substantially symmetrical radius.

21. The MTJ of claim 16, further comprising an inter-metal dielectric (IMD) layer disposed below the pinned layer.

22. The MTJ of claim 16 provided in a magnetic random access memory (MRAM) bit cell.

23. The MTJ of claim 16 integrated into an integrated circuit (IC).

24. The MTJ of claim 16 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

25. A magnetic random access memory (MRAM) system, comprising:
an MRAM array provided in a semiconductor die, the MRAM array comprising a plurality of MRAM bit cells; and
each of the plurality of MRAM bit cells comprising:
an access transistor comprising a gate coupled to a write line, a first electrode, and a second electrode; and
a magnetic tunnel junction (MTJ), comprising:
a first electrode layer coupled to a bitline;
a second electrode layer coupled to an electrode of the access transistor;
a tunnel barrier between the first electrode layer and the second electrode layer;
a pinned layer having a pinned layer width, the pinned layer disposed between the second electrode and the tunnel barrier;
a free layer between the first electrode and the tunnel barrier, the free layer having a free layer width smaller than the pinned layer width; and
a shadow-effect compensated ion beam etched hard mask disposed above the free layer between the free layer and the first electrode layer.

26. The MRAM system of claim 25, wherein the free layer in the MTJ in each of the plurality of MRAM bit cells is comprised of a shadow-effect compensated ion beam etched free layer.

27. The MRAM system of claim 25, wherein the shadow-effect compensated ion beam etched hard mask in the MTJ in each of the plurality of MRAM bit cells is an only shadow-effect compensated ion beam etched layer.

28. The MRAM system of claim 25, wherein the free layer in the MTJ in each of the plurality of MRAM bit cells is substantially free of a free layer footing.

29. The MRAM system of claim 25, wherein the free layer in the MTJ in each of the plurality of MRAM bit cells has a substantially symmetrical radius.

* * * * *